United States Patent
Hong et al.

(10) Patent No.: US 12,252,627 B2
(45) Date of Patent: Mar. 18, 2025

(54) PHOTOSENSITIVE RESIN COMPOSITION, FILM PREPARED FROM THE SAME, AND ELECTRONIC APPARATUS INCLUDING THE FILM

(71) Applicant: Samsung Display Co., Ltd., Yongin-si (KR)

(72) Inventors: Sunghwan Hong, Yongin-si (KR); Beomsoo Shin, Yongin-si (KR); Sukhoon Kang, Yongin-si (KR); Jeongsoo Kim, Yongin-si (KR); Jongmin Ok, Yongin-si (KR); Minseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 375 days.

(21) Appl. No.: 17/805,008

(22) Filed: Jun. 1, 2022

(65) Prior Publication Data

US 2022/0403179 A1      Dec. 22, 2022

(30) Foreign Application Priority Data

Jun. 2, 2021  (KR) .................... 10-2021-0071474
May 10, 2022 (KR) .................... 10-2022-0057389

(51) Int. Cl.
  *C09D 4/00* (2006.01)
  *C08F 220/06* (2006.01)
  *H10K 59/122* (2023.01)
  *H10K 59/38* (2023.01)

(52) U.S. Cl.
  CPC ............. *C09D 4/00* (2013.01); *C08F 220/06* (2013.01); *H10K 59/122* (2023.02); *H10K 59/38* (2023.02)

(58) Field of Classification Search
  CPC ........ C09D 4/00; C08F 220/06; C08F 220/32; H10K 59/122; H10K 59/38; G03F 7/004; G03F 7/027
  See application file for complete search history.

(56) References Cited

U.S. PATENT DOCUMENTS

| | | | |
|---|---|---|---|
| 7,728,513 B2 | 6/2010 | Seo et al. | |
| 8,481,161 B2 | 7/2013 | Park et al. | |
| 2023/0053715 A1* | 2/2023 | Sawaki | ................. C08F 290/06 |
| 2023/0182382 A1* | 6/2023 | He | ........................ B29C 64/165 |
| | | | 264/494 |
| 2023/0219336 A1* | 7/2023 | Enomoto | .............. B41C 1/1016 |
| | | | 430/269 |

(Continued)

FOREIGN PATENT DOCUMENTS

| | | |
|---|---|---|
| CN | 111269611 A | 6/2020 |
| JP | 2010-062129 A | 3/2010 |
| KR | 10-1145823 B1 | 5/2012 |

(Continued)

*Primary Examiner* — Douglas W Owens
(74) *Attorney, Agent, or Firm* — Womble Bond Dickinson (US) LLP

(57) ABSTRACT

A photosensitive resin composition and an electronic apparatus including the same are provided. The photosensitive resin composition includes: a first unit including one or more acryloyl groups, a second unit including one or more epoxy groups, and a third unit including at least one hydrophilic group, wherein a ratio of the equivalent weight of the acryloyl group to the equivalent weight of the epoxy group is 2:1 or more.

20 Claims, 19 Drawing Sheets

(56) References Cited

U.S. PATENT DOCUMENTS

2023/0393468 A1* 12/2023 Yanagi .................... G03F 7/105

FOREIGN PATENT DOCUMENTS

| KR | 10-1291855 B1 | 7/2013 |
| KR | 10-1559692 B1 | 10/2015 |
| KR | 10-2020-0049618 A | 5/2020 |
| KR | 10-2118627 B1 | 6/2020 |
| KR | 10-2021-0086867 A | 7/2021 |

* cited by examiner

PHOTOSENSITIVE RESIN COMPOSITION, FILM PREPARED FROM THE SAME, AND ELECTRONIC APPARATUS INCLUDING THE FILM

CROSS-REFERENCE TO RELATED APPLICATIONS

This application claims priority to and the benefit of Korean Patent Application Nos. 10-2021-0071474, filed on Jun. 2, 2021 and 10-2022-0057389, filed on May 10, 2022, in the Korean Intellectual Property Office, the entire contents of which are hereby incorporated by reference.

BACKGROUND

1. Field

Aspects of one or more embodiments of the present disclosure relate to a photosensitive resin composition, a film prepared from the same, and an electronic apparatus including the film.

2. Description of the Related Art

Electronic apparatuses, such as an organic light-emitting display apparatus, embody an image by generating light on the principle that the holes and the electrons respectively injected from an anode and a cathode recombine in an emission layer to emit light. For example, pixels emitting red, green, or blue light are included to express a desired or suitable color by color combination thereof.

To this end, each pixel includes: a light-emitting device that generates monochromatic light such as white or blue; and a quantum dot layer, a color filter, and/or the like, as a light controller for converting the monochromatic light into light of a target color of red, green, and/or blue and emitting the converted color of light. For example, when a light-emitting device of each pixel generates monochromatic light, the monochromatic light is converted into light of a color of red, green, and/or blue while passing through the quantum dot layer and the color filter, and due to a color combination of pixels, each emitting light of an appropriate or suitable color, a target color of an image is embodied.

SUMMARY

An aspect of one or more embodiments of the present disclosure is directed toward a photosensitive resin composition for forming a bank, in which the wettability of a quantum dot layer is not deteriorated even when the baking process temperature for a bank is high. One or more embodiments include a photosensitive resin composition for forming a bank in which, even when a residual film of the photosensitive resin composition is formed, the wettability of a quantum dot layer formed thereon is not deteriorated.

An aspects of one or more embodiments of the present disclosure is directed toward an electronic apparatus having a bank formed by the photosensitive resin composition for forming the bank.

Additional aspects of one or more embodiments of the present disclosure will be set forth in part in the description, which follows and, in part, will be apparent from the description, or may be learned by practice of the presented embodiments of the disclosure.

According to one or more embodiments, a photosensitive resin composition includes:

a first unit including one or more acryloyl groups;
a second unit including one or more epoxy groups;
a third unit including one or more hydrophilic groups; and
a solvent, wherein
the ratio of the equivalent weight of the acryloyl groups to the equivalent weight of the epoxy groups may be not less than (e.g., greater than or equal to) 2:1.

In one or more embodiments, the ratio of the equivalent weight of the hydrophilic groups to the equivalent weight of the epoxy groups may be greater than or equal to about 1:1.

In one or more embodiments, the hydrophilic groups may be a hydroxyl group, a carboxyl group, an imide group, an epoxy group, an ether group, or one or more combinations thereof.

In one or more embodiments, the sum of the amounts of the first unit and the second unit may be about 30 wt % to about 70 wt % with respect to a total weight of the photosensitive resin composition excluding the solvent.

In one or more embodiments, the first unit may further include a monomer or oligomer including 2 to 8 acryloyl groups and having a weight average molecular weight (Mw) of 5,000 or less.

In one or more embodiments, the first unit may be a photocuring unit (e.g., may have suitable photocurability), and the second unit may be a thermo-curing unit (e.g., may have suitable thermocurability).

In one or more embodiments, the photosensitive resin composition may further include a fourth unit including one or more cyclic groups.

For example, an equivalent weight of the fourth unit may be 70% or less based on the equivalent weight of the epoxy groups.

In one or more embodiments, the photosensitive resin composition may further include a fifth unit having an acid value of about 50 mg KOH/g or greater and about 250 mg KOH/g or less.

For example, a ratio of the equivalent weight of the epoxy group to the equivalent weight of the fifth unit may be 1.5:1 or less.

In one or more embodiments, the photosensitive resin composition may further include a leveling agent including an ether group (—O—).

For example, the leveling agent may include a compound represented by Formula 1:

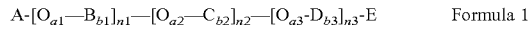

$$A\text{-}[O_{a1}\text{---}B_{b1}]_{n1}\text{---}[O_{a2}\text{---}C_{b2}]_{n2}\text{---}[O_{a3}\text{-}D_{b3}]_{n3}\text{-}E \qquad \text{Formula 1}$$

$$CF_xX_{(3-x)}(1\leq x\leq 3) \qquad \text{Formula 2}$$

$$CF_yX_{(2-y)}(1\leq y\leq 2) \qquad \text{Formula 3}$$

wherein, in Formula 1,
A may be a group represented by Formula 2,
B, C, and D may each independently be a group represented by Formula 3,
E may be hydrogen; a halogen atom; a carboxyl group, a ketone group, a sulfonic acid group, an acrylate group, a hydroxyl group, or one or more salts thereof,
a1, a2, and a3 may each independently be 0 or 1,
b1, b2, and b3 may each independently be an integer from 1 to 5,
n1, n2, and n3 may each independently be an integer from 0 to 10, and n1+n2+n3≥1, and
in Formula 2 and Formula 3,
X may be H, Cl, or $CY_3$ (Y may be F or Cl).
For example, the leveling agent may include a —$CF_2$—O— group.

For example, the leveling agent may include perfluoropolyether (PFPE), perfluoroalkyl ether carboxylic acid (PFECA), a perfluoroalkyl ethercarboxylate anionic polymer, chlorinated polyfluorinated ether sulfonate (CPFESA), or one or more combinations thereof.

In one or more embodiments, the amount of the leveling agent may be from about 0.1 wt % to about 3.0 wt % based on the total weight of the photosensitive resin composition excluding the solvent.

In one or more embodiments, the photosensitive resin composition may further include one or more selected from a crosslinking agent, an initiator, a thermo-curing agent, a pigment, and a scattering agent.

According to one or more embodiments, a film formed by curing the photosensitive resin composition described above may be provided.

According to one or more embodiments, an electronic apparatus includes:
  a first substrate on which a plurality of light-emitting devices may be located;
  a plurality of light controllers corresponding to the plurality of light-emitting devices on the first substrate; and
  a plurality of banks arranged among the plurality of light controllers,
  wherein at least one of the plurality of banks is formed of the photosensitive resin composition described above.

In one or more embodiments, the plurality of banks may be cured by performing a baking process at a temperature of about 80° C. to about 250° C.

In one or more embodiments, the light controllers may include a quantum dot layer, a color filter layer, or a combination thereof.

In one or more embodiments, the light-emitting device may include an OLED, micro LED, a QLED, an LED, or an LCD.

In one or more embodiments, a portion exposed among the banks may include a step.

In one or more embodiments, the light controllers may be formed by an inkjet printing process.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
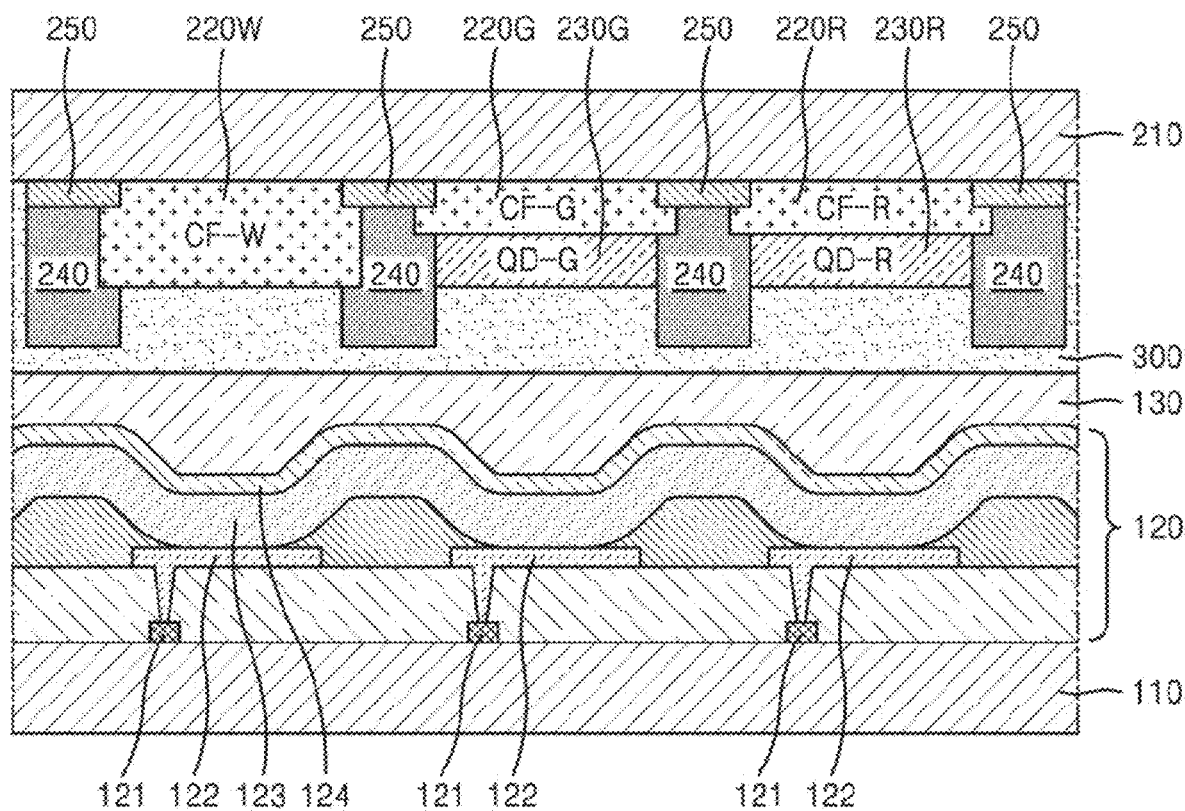
FIG. 1 is a cross-sectional view of an electronic apparatus according to an embodiment of the disclosure.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c", "at least one selected from a, b, and c", etc., indicates only a, only b, only c, both (e.g., simultaneously) a and b, both (e.g., simultaneously) a and c, both (e.g., simultaneously) b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the present disclosure will be described in more detail with reference to the accompanying drawings. The same or corresponding components will be denoted by the same reference numerals, and thus redundant description thereof will not be provided.

It will be understood that although the terms "first," "second," etc. may be utilized herein to describe one or more suitable components, these components should not be limited by these terms. These components are only utilized to distinguish one component from another.

An expression utilized in the singular encompasses the expression of the plural, unless it has a clearly different meaning in the context.

It will be further understood that the terms "include/comprise" and/or "have" utilized herein specify the presence of stated features or elements, but do not preclude the presence or addition of one or more other features or elements.

Sizes of elements in the drawings may be exaggerated for convenience of explanation. For example, because sizes and thicknesses of components in the drawings are arbitrarily illustrated for convenience of explanation, the following embodiments are not limited thereto.

When a certain embodiment is implemented differently, a specific process order may be performed differently from the described order. For example, two processes described in succession may be performed substantially concurrently (e.g., simultaneously), or may be performed in an order opposite to the described order.

It will be understood that when a layer, a region, or a component is referred to as being "connected to" another layer, region, or component, the layer, the region, or the component may be directly connected to the another layer, region, or component, or indirectly connected to the another layer, region, or component while an intervening layer, region, or component is present therebetween. For example, it will be understood that when a layer, a region, or a component is referred to as being "electrically connected to" another layer, region, or component, the layer, the region, or the component may be directly electrically connected to the another layer, region, or component, or indirectly electrically connected to the another layer, region, or component as an intervening layer, region, or component is present therebetween.

The equivalent weight ratio of group A is calculated by the following methods herein.

(1) In an embodiment in which information on group A included in each group is known:

The equivalent weight of group A may be calculated by multiplying the number of the groups (group A) in each unit by a molar equivalent or component ratio of the unit.

(2) In an embodiment in which information on group A included in each group is unknown:

The ratio of group A with respect to a total amount of the compound before being cured may be calculated from the peak area ratio obtained by Fourier-transform infrared spectroscopy (FT-IR) (For example, FT-IR epoxy: O—H: 3700~3200 $cm^{-1}$, acrylate: 810 $cm^{-1}$).

Photosensitive Resin Composition

In the embodiment in which quantum dot-organic light-emitting devices (QD-OLEDs) are utilized in a large-area display, when a quantum dot pattern is formed by an exposure process, the cost of quantum dots itself is high and the cost of loss in the process is also high. Accordingly, the inkjet printing process capable of forming a quantum dot layer only in a necessary portion when forming a quantum dot layer pattern is advantageous in terms of reducing costs and increasing efficiency. Before inkjet printing of quantum dots, a bank pattern is formed by an exposure process utilizing a photosensitive resin composition to define an area where the quantum dot pattern will be formed.

However, when the bank pattern is formed through a post baking process at a temperature of 85° C. or more, for example, about 180° C., the wettability of the quantum dot ink with respect to an underlying layer is lowered. The decrease in the wettability of the quantum dot ink may be caused by, i) when the temperature of the post baking is increased, a phenomenon in which uncured components in the bank composition are deposited in the active area where the quantum dot ink is to be printed (that is, a re-deposition phenomenon), ii) a residual debris/residual film phenomenon in which a fluorine-based polymer exists within the active area, iii) hydrophobization of the bank slope due to an increase in the distribution of fluorine-based polymer in the bank, and iv) a bank reflow due to the flow of fluorine-based polymer in the bank slope.

When an additional exposure is performed before post-baking, the re-deposition phenomenon of uncured components may be suppressed or reduced, but this complicates the process.

A photosensitive resin composition according to one or more embodiments of the disclosure includes: a first unit including at least one photo-curable group; a second unit including at least one thermo-curable group; and a third unit including at least one hydrophilic group, wherein a ratio (e.g., amount) of the equivalent weight of the photo-curable group to the equivalent weight of the thermo-curable group is 2:1 or greater.

In one or more embodiments, the photosensitive resin composition includes the photo-curable group in a higher equivalent weight than the thermo-curable group. Thus, the photocuring rate is higher than the thermal curing rate. The ratio of the equivalent weight of the photo-curable group to the equivalent weight of the thermo-curable group is 10:1 or less. When the ratio of the equivalent weight of the photo-curable group to the equivalent weight of the thermo-curable group satisfies this range, the quantum dot inkjet printing formed between the bank patterns may secure excellent or suitable wettability.

The photo-curable group is a group that is suitably cured by reaction when photo exposed, and may be, for example, an acryloyl group. The thermo-curable group is a group that is suitably cured by reaction due to heat, and may be, for example, an epoxy group.

Figure 4:
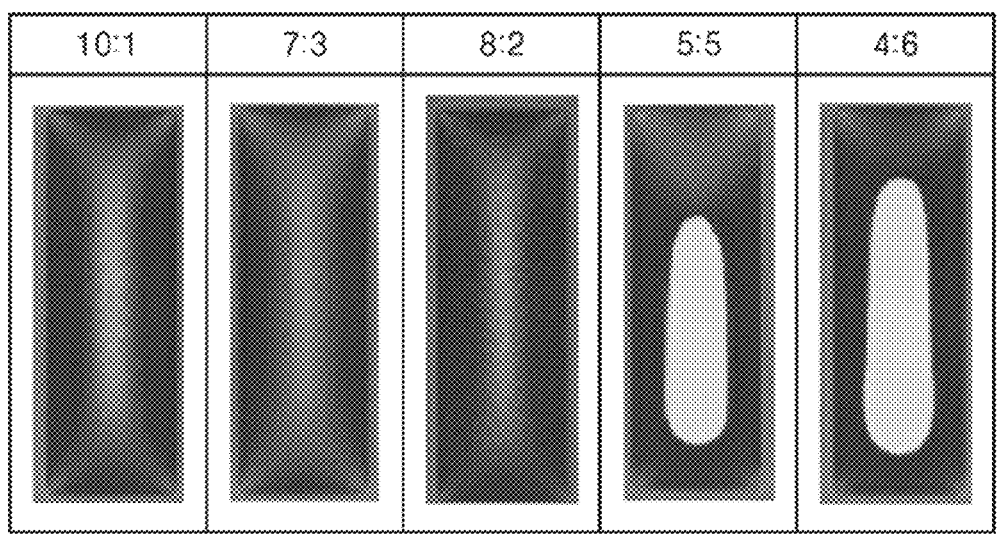
FIG. 4 shows images showing results of an evaluation of wettability in a printing process according to changes in the equivalent weight ratio of the acryloyl group to the epoxy group.

This will be described in greater detail with reference to FIG. 4. FIG. 4 shows wettability evaluation results during a quantum dot printing process according to the change in the equivalent weight ratio of the acryloyl group and the epoxy group in the composition for forming a bank.

In more detail, FIG. 4 are images when the equivalent weight ratio of the acryloyl group to the epoxy group is adjusted to be 10:1, 8:2, 7:3, 5:5, and 4:6, respectively, in printing the composition to the thickness of 5 μm with respect to a thickness of 10 μm. The wording "printing a 5 μm photosensitive resin composition with reference to 10 μm thickness" refers to printing up to the thickness of 5 μm when the target thickness is 10 μm.

The embodiments, illustrated in FIG. 4, in which the ratio of acryloyl group to epoxy group equivalent weight in the photosensitive resin composition for bank formation is 10:1, 7:3 and 8:2, it can be confirmed that the wettability of quantum dot printing is excellent or suitable. In contrast, in the embodiment in which the ratios of the acryloyl group to epoxy are 5:5 and 4:6, it can be seen that the quantum dot printing is not performed well.

In one or more embodiments, the first unit is not limited as long as it contains an acryloyl group, and the first unit may constitute a monomer, a binder, and/or an additive in the photosensitive resin composition. For example, the first unit may include epoxyacrylate, methyl(meth)acrylate, ethyl (meth)acrylate, n-butyl(meth)acrylate, sec-butyl(meth)acrylate, tert-butyl(meth)acrylate, hydroxyphenyl(meth)acrylate, glycidyl(meth)acrylate, β-methylglycidyl(meth)acrylate, β-ethylglycidyl(meth)acrylate, 3,4- epoxycyclohexylmethylacrylate, 3,4-epoxycyclohexylmethylmethacrylate, tetrahydrofurfurylacrylate, tetrahydrofurfurylmethacrylate, cyclohexyl(meth)acrylate, 2-methylcyclohexyl(meth)acrylate, tricyclo[5.2.1.0]decan-8-yl(meth)acrylate, dicyclopentanyloxyethyl(meth)acrylate, tricyclo[5.2.1.0]decen-8-yl (meth)acrylate, isobornyl(meth)acrylate, 2-hydroxyethyl (meth)acrylate, 2-hydroxypropyl(meth)acrylate, phenyl (meth)acrylate, and/or benzyl(meth)acrylate;

1,3-butanedioldi(meth)acrylate, 1,3-butanediol(meth) acrylate, 1,6-hexanedioldi(meth)acrylate, ethylene glycoldi(meth)acrylate, diethylene glycoldi(meth)acrylate, neopentylglycoldi(meth)acrylate, triethylene glycoldi(meth) acrylate, tetraethylene glycoldi(meth)acrylate, polyethylene glycoldiacrylate, bisphenol A bis(acryloyloxyethyl)ether, ethoxylated bisphenol A di(meth)acrylate, propoxylated neopentylglycoldi(meth)acrylate, ethoxylated neopentylglycoldi(meth)acrylate, and/or 3-methylpentanediodi(meth) acrylate; and/or trimethylolpropane tri(meth)acrylate, pentaerythritol tri (meth)acrylate, tris(2-hydroxyethyl)isocyanurate tri(meth) acrylate, ethoxylated trimethylolpropane tri(meth)acrylate, propoxylated trimethylolpropane tri(meth)acrylate, pentaerythritol tetra(meth)acrylate, dipentaerythritol penta(meth)acrylate, dipentaerythritol hexa(meth)acrylate, tripentaerythritol tetra(meth)acrylate, tripentaerythritol penta (meth)acrylate, tripentaerythritol hexa(meth)acrylate, tripentaerythritol hepta(meth)acrylate, tripentaerythritol octa(meth)acrylate, a reaction product of pentaerythritol tri(meth)acrylate and an acid anhydride, a reaction product of dipentaerythritol penta(meth)acrylate and an acid anhydride, a reaction product of tripentaerythritol hepta(meth) acrylate and an acid anhydride, caprolactone modified trimethylolpropane tri(meth)acrylate, caprolactone modified pentaerythritol tri(meth)acrylate, caprolactone modified tris (2-hydroxyethyl)isocyanurate tri(meth)acrylate, caprolactone modified pentaerythritol tetra(meth)acrylate, caprolactone modified dipentaerythritol penta(meth)acrylate, caprolactone modified dipentaerythritol hexa(meth)acrylate, caprolactone modified tripentaerythritol tetra(meth)acrylate, caprolactone modified tripentaerythritol penta(meth)acrylate, caprolactone modified tripentaerythritol hexa(meth) acrylate, caprolactone modified tripentaerythritol hepta(meth)acrylate, caprolactone modified tripentaerythritol octa (meth)acrylate, a reaction product of caprolactone modified pentaerythritol tri(meth)acrylate and an acid anhydride, a reaction product of caprolactone modified dipentaerythritol penta(meth)acrylate and an acid anhydride, a reaction product of caprolactone modified tripentaerythritol hepta(meth) acrylate and an acid anhydride, or one or more combinations thereof, but embodiments of the disclosure are not limited thereto.

In one or more embodiments, the photosensitive resin composition may further include, as a first unit, a monomer or oligomer including 2 to 8 acryloyl groups and having a weight average molecular weight (Mw) of 5,000 or less. The monomer or oligomer may perform an auxiliary function for the first unit included in, for example, the binder, and may be photocurable.

The thermo-curable group of the second unit is not limited as long as it contains an epoxy group, and may include a monomer, a binder, and/or an additive in the photosensitive resin composition.

For example, the second unit may include glycidyl (meth)acrylate, P-methyl glycidyl (meth)acrylate, p-ethyl glycidyl (meth)acrylate, glycidylvinylether, o-vinylbenzyl glycidylether, m-vinylbenzyl glycidylether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-bis(glycidyloxymethyl)styrene, 2,4-bis(glycidyloxymethyl)styrene, 2,5-bis(glycidyloxymethyl)styrene, 2,6-bis(glycidyloxymethyl)styrene, 2,3,4-tris(glycidyloxymethyl)styrene, 2,3,5-tris(glycidyloxymethyl)styrene, 2,3,6-tris(glycidyloxymethyl)styrene, 3,4,5-tris(glycidyloxymethyl)styrene, 2,4,6-tris(glycidyloxymethyl)styrene, vinylcyclohexene monoxide, 1,2-epoxy-4-vinyl cyclohexane, 3,4-epoxycyclohexylmethyl acrylate, 3,4-epoxycyclohexylmethyl methacrylate, a compound represented by Formula (I), a compound represented by Formula (II), or one or more combinations thereof:

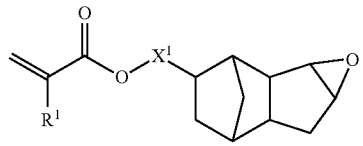

Formula (I)

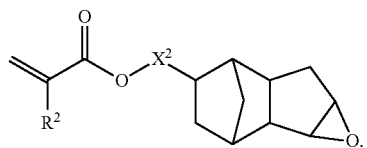

Formula (II)

In Formula (I) and Formula (II), $R^1$ and $R^2$ may each independently indicate a hydrogen atom, or an alkyl group having 1 to 4 carbon atoms, and/or hydrogen atoms included in the alkyl group may be substituted with a hydroxy group, $X^1$ and $X^2$ each independently indicate a single bond, *—$R^3$—, *—$R^3$—O—, *—$R^3$—S— or *—$R^3$—NH—, $R^3$ indicates an alkylene group having 1 to 6 carbon atoms, and

* indicates a binding site to an adjacent atom.

In one or more embodiments, the sum of the amounts of the first unit and the second unit may be about 30 wt % to about 70 wt % with respect to a total weight of the photosensitive resin composition excluding the solvent. For example, the sum of the amounts of the first unit and the second unit may be about 30 wt % to about 70 wt % with respect to a total weight of the solids of the photosensitive resin composition.

In one or more embodiments, the hydrophilic group may be a hydroxyl group, a carboxyl group, an imide group, an epoxy group, an ether group, or one or more combinations thereof.

In one or more embodiments, the ratio of the equivalent weight of the hydrophilic group to the equivalent weight of the thermo-curable group may be about 1:1 or greater. In one or more embodiments, the ratio of the equivalent weight of the hydrophilic group to the equivalent weight of the epoxy group may be about 1:1 or greater. For example, the ratio of the equivalent weight of the hydrophilic group to the equivalent weight of the epoxy group may be about 1:1 to about 5:1. When the ratio of the equivalent weight of the hydrophilic group to the equivalent weight of the thermo-curable satisfies the ranges described above, wettability may be ensured in a printing process.

Figure 5:
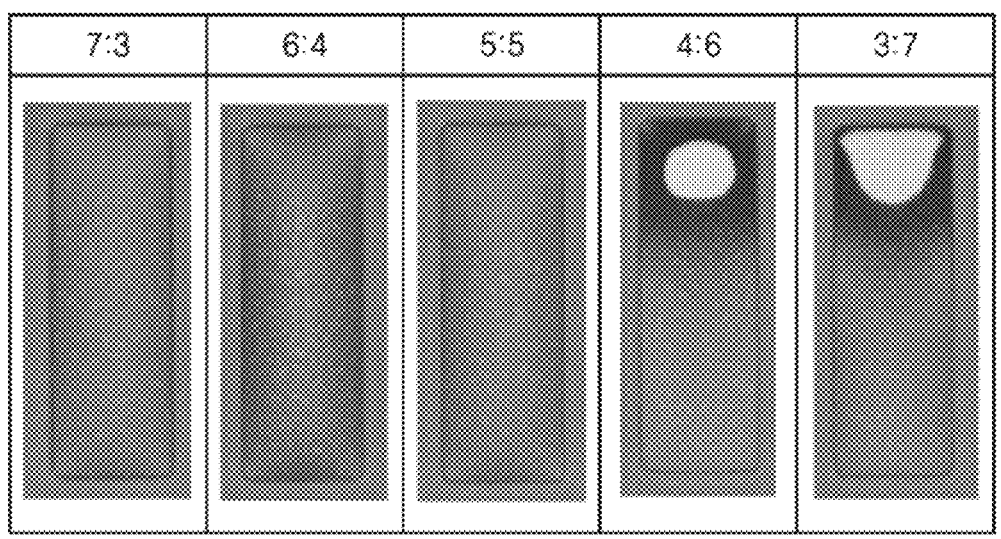
FIG. 5 shows images showing results of an evaluation of wettability in a printing process according to changes in the equivalent weight ratio of the hydrophilic group to the epoxy group.

This will be described in greater detail with reference to FIG. 5. FIG. 5 show images as results of evaluation of wettability in a printing process according to changes in the equivalent weight ratio of the hydrophilic group to the epoxy group.

For example, FIG. 5 shows images when the equivalent weight ratio of the hydrophilic group to the epoxy group is adjusted to be 7:3, 6:4, 5:5, 4:6, and 3:7, respectively, in printing the composition to 5 μm with respect to 10 μm. Referring to FIG. 5, it can be confirmed that the wettability of quantum dot printing is excellent or suitable when the equivalent weight ratio of the hydrophilic group to the epoxy group is 7:3, 6:4, 5:5, for example, 1:1 or more. In contrast, it can be seen that when the equivalent weight ratio of the hydrophilic group to the epoxy group is 4:6 and 3:7, for example, less than 1:1, quantum dot printing is not performed well.

In one or more embodiments, the photosensitive resin composition may further include a fourth unit including at least one cyclic group. For example, the cyclic group may be an aromatic group, and may be, for example, a benzene group or a benzyl group. The fourth unit may constitute a monomer, a binder, and/or an additive in the photosensitive resin composition. The photosensitive resin composition may, by including the fourth unit, improve the strength of banks when the banks are later formed.

For example, an equivalent weight of the fourth unit may be 70% or less based on the equivalent weight of the thermo-curable group. For example, an equivalent weight of the fourth unit may be 70% or less based on the equivalent weight of the epoxy group. When the equivalent weight of the fourth unit exceeds the above range over 70% of the equivalent weight of the thermo-curable group, the density of banks formed from the composition may be reduced, and the bank composition may invade the active region.

In one or more embodiments, the photosensitive resin composition may further include a fifth unit having an acid value of about 50 mg KOH/g or greater and about 250 mg KOH/g or less. The fifth unit may be a functional group participating in the development of the photosensitive resin. The fifth unit may constitute a monomer, a binder, and/or an additive in the photosensitive resin composition. For example, the fifth unit may include acrylic acid, carboxylic acid, and/or the like.

For example, a ratio of the equivalent weight of the thermo-curable group to the equivalent weight of the fifth unit may be 1.5:1 or less. For example, a ratio of the equivalent weight of the epoxy group to the equivalent weight of the fifth unit may be 1.5:1 or less. As the amount of the fifth unit included is within the above ranges, the developability of residual debris and residual material may be increased.

Leveling Agent

In one or more embodiments, the photosensitive resin composition may further include a leveling agent including an ether group (—O—). The leveling agent may help the photosensitive resin composition be substantially uniformly coated on an underlying layer to form a bank pattern well.

Quantum dot ink is optionally inkjet printed only in the active region where the bank is not formed to form a quantum dot layer, and even when the quantum dot ink is sprayed onto the bank, because the surface of the bank contains a liquid repellent component, the quantum dot layer is not formed on the bank.

In contrast, depending on the type or kind of a light-emitting device or the arrangement of wirings and contacts of an electronic apparatus, a step may be formed in the active region in which the quantum dot layer is formed. When there is a step in the active region, a residual film of the photosensitive resin composition may remain at, for example, the bottom of the step when the bank pattern is formed. The wettability of the quantum dot ink inkjet-printed on the residual film of the photosensitive resin composition may be decreased. When the wettability of the inkjet-printed quantum dot ink is decreased, the quantum dot layer may not be formed well.

In an embodiment of the present disclosure of the photosensitive resin composition, due to the leveling agent containing an ether group (—O—), even when the residual film remains, because the residual film may have hydrophilicity, the wettability of the quantum dot ink on the residual film may be high. In some embodiments, the leveling agent may provide structurally wettability by including an ether group (—O—), which will be described in more detail with reference to FIG. 6.

Figure 6:
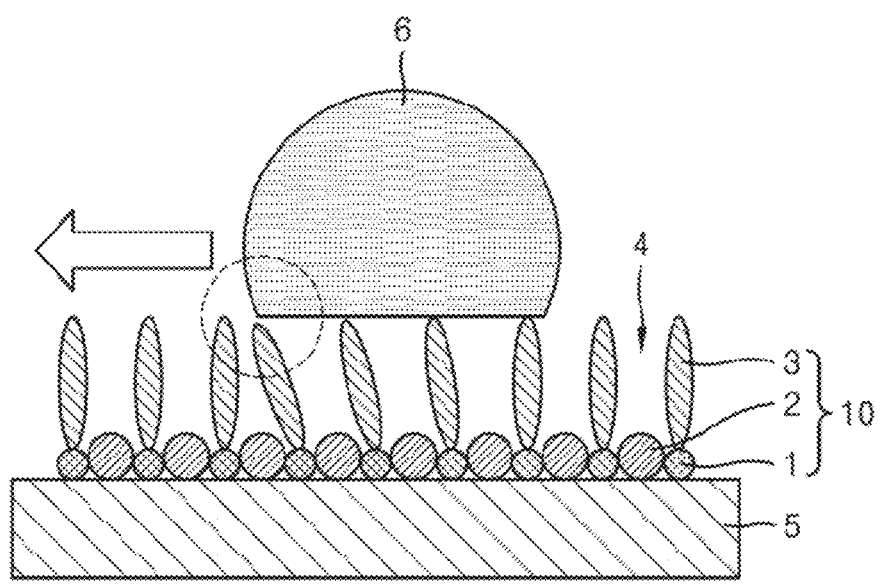
FIG. 6 illustrates a conceptual view of structural features of a leveling agent having an ether group according to an embodiment.

FIG. 6 illustrates a conceptual view of structural features of a leveling agent having an ether group according to an embodiment. Referring to FIG. 6, a residual film including a leveling agent 10 is formed on a substrate 5. The leveling agent 10 includes an ether group 2 in a carbon chain 1 having a substituent 3. Because the ether group 2 does not have a substituent, a space 4 is provided by the ether group 2. Due to the space 4 secured in this way, the substituent 3 adjacent to the ether group 2 may move freely, which may improve the flowability of the quantum dot ink 6 on the residual film containing the leveling agent 10.

For example, the leveling agent may include a —CF$_2$—O— group.

For example, the leveling agent may include perfluoropolyether (PFPE), perfluoroalkyl ether carboxylic acid (PFECA), a perfluoroalkyl ethercarboxylate anionic polymer, chlorinated polyfluorinated ether sulfonate (CPFESA), or one or more combinations thereof.

For example, the leveling agent may include a compound represented by Formula 1:

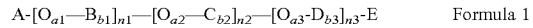

A-[O$_{a1}$—B$_{b1}$]$_{n1}$—[O$_{a2}$—C$_{b2}$]$_{n2}$—[O$_{a3}$-D$_{b3}$]$_{n3}$-E    Formula 1

CF$_x$X$_{(3-x)}$(1≤x≤3)    Formula 2

CF$_y$X$_{(2-y)}$(1≤y≤2)    Formula 3 wherein, in Formula 1,
A may be a group represented by Formula 2,
B, C, and D may each independently be a group represented by Formula 3,
E may be hydrogen; a halogen atom; a carboxyl group, a ketone group, a sulfonic acid group, an acrylate group, a hydroxyl group, or one or more salts thereof,
a1, a2, and a3 may each independently be 0 or 1,
b1, b2, and b3 may each independently be an integer from 1 to 5,
n1, n2, and n3 may each independently be an integer from 0 to 10, and n1+n2+n3≥1, and
in Formula 2 and Formula 3,
X may be H, Cl, or CY$_3$ (Y may be F or Cl).

In one or more embodiments, the amount of the leveling agent may be from about 0.1 wt % to about 3.0 wt % based on the total weight of the photosensitive resin composition excluding the solvent.

When the leveling agent is present in the above range, the photosensitive resin composition may be substantially evenly coated at a substantially uniform thickness on the underlying layer, and when a residual film of the photosensitive resin composition occurs, the wettability of quantum dot ink on the residual film may be high.

In one or more embodiments, the photosensitive resin composition may further include a wetting agent and/or a liquid repellent.

In one or more embodiments, the photosensitive resin composition may further include one or more selected from a crosslinking agent, an initiator, a curing agent (e.g., thermos-curing agent), a pigment, and a scattering agent.

The crosslinking agent may include at least one monomer selected from a crosslinking monomer having an ethylenically unsaturated group, and a urethane monomer.

The crosslinking monomer having an ethylenically unsaturated group may be selected from 1,4-butanediol diacrylate, 1,3-butylene glycol diacrylate, ethylene glycol diacrylate, pentaerythritol tetraacrylate, triethylene glycol diacrylate, polyethylene glycol diacrylate, dipentaerythritol diacrylate, sorbitol triacrylate, a bisphenol A diacrylate derivative, trimethylolpropane triacrylate, dipentaerythritol tetraacrylate, dipentaerythritol hexaacrylate, and methacrylates thereof. In some embodiments, the crosslinking monomer having an ethylenically unsaturated group may include a dendrimer in which double bonds are randomly bonded.

As the urethane monomer, a general crosslinking monomer having a urethane structure may be utilized, and the type or kind thereof is not limited.

In one or more embodiments, the amount of the crosslinking agent may be within the range of about 3 wt % to about 15 wt % with respect to a total weight of the photosensitive resin composition. For example, the amount of the crosslinking agent may be within the range of about 3 wt % to about 10 wt % with respect to a total weight of the photosensitive resin composition. When the amount of the crosslinking agent satisfies these ranges, a photosensitive resin composition having excellent or suitable photocurability, developability with an alkaline developer solution, and substantial straightness in forming a pattern may be provided. When the amount of the crosslinking agent is less than 3 wt %, chemical resistance may be reduced as the degree of curing is reduced. When the amount of the crosslinking agent exceeds 15 wt %, adhesiveness may be reduced as the film is hardened.

In one or more embodiments, the crosslinking agent may further include a thiol-based monomer, in addition to the crosslinking monomer having an ethylenically unsaturated group and/or the urethane monomer. When the crosslinking agent includes a thiol-based monomer, the amount of the thiol-based monomer may be in a range of about 0.01 wt % to about 1 wt % with respect to the total weight of the photosensitive resin composition, but is not limited thereto. The thiol-based monomer may be a trivalent or higher polythiol, and may be selected from for example, tris[2-(3-mercaptopropionyloxy)ethyl]isocyanurate (TEMPIC) and [pentaerythritol tetrakis(3-mercaptopropionate)]. As the crosslinking agent further includes such a thiol-based monomer, crosslinking performance may be further improved. In some embodiments, the thiol-based monomer may harden rapidly at low temperatures, and thus, may impart strong adhesiveness and improve chemical resistance against a solvent.

The photosensitive resin composition may include a curing agent.

The curing agent may be stable at room temperature, and may work (be effective) at a temperature of, for example, about 80° C. to about 250° C., and the type or kind thereof is not limited.

The curing agent may include at least one selected from an aliphatic amine-based compound, an alicyclic amine-based compound, an aromatic amine-based compound, a carboxylic acid-based compound, an acid anhydride-based compound, a polyphenol-based compound, and an imidazole-based compound.

The curing agent may be a commercially available aromatic amine-based compound, for example, Isophorone Diamine (Product name: Baxxodur® EC 201, BASF Corporation), PN-23, MY-24, PN-40J, PN-31, AH-300, MY-24 (AJINOMOTO FINE TECHNO Co., Inc.).

The amount of the curing agent may be in a range of about 0.1 wt % to about 5 wt % with respect to the total weight of the photosensitive resin composition. When this range is satisfied, the degree of curing at low temperature and storage stability may be excellent or suitable.

When the amount of the curing agent is less than 0.1 wt %, thermocurability of the inkjet ink may deteriorate, causing color mixing during deposition. When the amount of the curing agent exceeds 5 wt %, stability may be reduced over time.

The photosensitive resin composition may include an initiator. The initiator may initiate the polymerization of the crosslinking monomer induced by wavelengths, such as visible rays, ultraviolet rays, far ultraviolet rays, and/or the like.

The initiator may include at least one selected from an oxime-based compound, a triazine-based compound, a benzoin-based compound, an acetophenone-based compound, a xanthone-based compound, and an imidazole-based compound, but is not limited thereto.

The initiator may be an oxime-based compound, for example, OXE-01 and OXE-02, which are manufactured by BASF; a triazine-based compound, such as 2,4-bistrichloromethyl-6-p-methoxystyryl-s-triazine, 2-p-methoxystyryl-4,6-bistrichloromethyl-s-triazine, 2,4-trichloromethyl-6-triazine, 2,4-trichloromethyl-4-methylnaphthyl-6-triazine; a benzoin-based compound such as benzophenone, p-(diethylamino)benzophenone, and/or the like; an acetophenone-based compound, such as 2,2-dichloro-4-phenoxyacetophenone, 2,2-diethoxyacetophenone, 2,2-dibutoxyacetophenone, 2-hydroxy-2-methylpropiophenone, p-t-butyltrichloroacetophenone, and/or the like; a xanthone-based compound, such as xanthone, thioxanthone, 2-methylthioxanthone, 2-isobutylthioxanthone, 2-dodecylthioxanthone, 2,4-dimethylthioxanthone, 2,4-diethylthioxanthone, and/or the like; and/or an imidazole-based compound, such as 2,2-bis-2-chlorophenyl-4,5,4',5'-tetraphenyl-1,2-bisimidazole, 2,2-bis(2,4,6-tricyanophenyl)-4,4,5,5-tetraphenyl-1, 2-bisimidazole.

The amount of the initiator may be in a range of about 1 wt % to about 10 wt % with respect to the total weight of the photosensitive resin composition. When the amount of the initiator satisfies this range, a photosensitive resin composition having excellent or suitable curability, storage stability and pattern straightness, and enabling easy pattern formation may be provided.

When the amount of the initiator is less than 1 wt %, the degree of curing of the composition may be reduced, the implementation of a pattern may be difficult, and the straightness of the pattern may be degraded. When the amount of the photoinitiator exceeds 10 wt %, storage stability and resolution may be reduced, and the residual debris may remain in a non-pattern region, when forming patterns utilizing the composition.

The photosensitive resin composition may include a pigment.

As the pigment, any of organic and inorganic pigments available in the field to which the disclosure belongs may be utilized. Examples of the organic pigment are: red pigments, such as C.I. #177, #202, #209, #242, #254, #255; yellow pigments, such as C.I. #150, #138, #128; orange pigments, such as C.I. #43; green pigments, such as C.I. #7, #36, #58; blue pigments, such as C.I. #15, #15:3, #15:6; and/or violet pigments, such as C.I. #23; black pigments, such as C.I. #1, #7. In some embodiments, the inorganic pigment may be titanium oxide, titanium black, carbon black, and/or the like. These pigments may be utilized in combination with at least one thereof for color combination.

The amount of the pigment may be about 3 wt % to about 15 wt % with respect to the total weight of the photosensitive resin composition. The pigment as described above may be added to the composition according to embodiments of the disclosure directly or in the form of a pigment dispersion including a dispersant, a solvent, and/or the like.

In this embodiment, as the dispersant that may be included in the pigment dispersion, a nonionic dispersant, an ionic dispersant, or a cationic dispersant may be selectively utilized. Examples thereof include: polyalkylene glycol and/or esters thereof; polyoxyalkylene; polyhydric alcohol ester alkylene oxide adducts; alcohol alkylene oxide adducts; and alkylamines, and/or the like, and these dispersants may be utilized alone or in appropriate or in a suitable combination. The dispersant may be included in an amount of about 1 part to about 5 parts by weight with respect to 100 parts by weight of the pigment.

In some embodiments, as the solvent that may be included in a composition for the pigment dispersion, ethylene glycol acetate, ethyl cellosolve, propylene glycol methyletheracetate, ethyl lactate, polyethylene glycol, cyclohexanone, propylene glycol methylether, etc. may be utilized. In this regard, the amount of the solvent may be adjusted such that the pigment or pigment dispersion has a solid content (e.g., amount) of about 5 wt % to about 30 wt %.

In some embodiments, the particle diameter of the pigment may be determined in consideration of dispersion stability, pixel resolution, and/or the like. In an embodiment, a number average particle diameter of the pigment may be in a range of about 30 nm to about 200 nm.

The amount of the pigment may be in a range of about 3 wt % to about 15 wt % with respect to the total weight of the photosensitive resin composition. The amount of the pigment may be varied in consideration of the color reproducibility according to the utilize of the pigment, pattern formability, adhesion, curing characteristics, and/or the like.

The photosensitive resin composition may include a scattering agent. The scattering agent may reflect the light emitted in the direction from the quantum dot layer to the bank, back toward the quantum dot layer. The scattering agent may include, for example, $TiO_2$, $SiO_2$, $BaSO_4$, $Al_2O_3$, ZnO, and/or $ZrO_2$.

The photosensitive resin composition may include a solvent for solubility or coatability.

The solvent may be, for example, at least one selected from propylene glycol monoethyl ether acetate, ethyl ethoxypropionate, butyl acetate, ethylene glycol monomethyl ether acetate, propylene glycol monomethyl ether, propylene glycol methylether acetate, diethylene glycol dimethyl ether, diethylene glycol methyl ethyl ether, cyclohexanone, 3-methoxy ethyl propionate, and 3-ethoxy methyl propionate.

In one or other embodiments, the solvent may be at least one selected from propylene glycol monoethyl ether acetate, ethyl ethoxypropionate, and butyl acetate.

The amount of the solvent may vary according to the viscosity or total solid content (e.g., amount) of the composition, and may be the remainder of the photosensitive composition of the disclosure excluding the amount of the utilized solids.

In one or more embodiments, the photosensitive resin composition according to embodiments of the disclosure may further include a dye, in addition to the pigment disclosed above. The dye, which has intrinsic spectral properties in a specific wavelength region, may control the transmittance and transmittance width of a film formed of the composition, through a synergistic action with a pigment exhibiting a specific color, so that not only color purity but also luminance, contrast, and/or the like can be improved. The dye may be at least one selected from fluorine-based, azo-based, antraquinone-based, indigo-based, xanthine-based, triphenylmethane-based, phthalocyanine-based, imine-based, and quinaphthalone-based compounds.

In some embodiments, in order to exhibit the synergistic effect of spectral properties according to the addition of the dye, the dye may be included in an amount of about 0.01 wt % to about 15 wt %, for example, about 0.01 wt % to about 5 wt %, for example, about 0.81 wt % to about 3 wt %, with respect to the total weight of the photosensitive resin composition.

The dye may be added to the composition according to embodiments of the disclosure directly or in the form of a dye dispersion including a dispersant, a solvent, and/or the like. In relation to the dispersant that may be included in the dye dispersion, the descriptions of the dispersant that may be included in the pigment dispersion may be referred to. The dispersant may be included in an amount of about 1 part to about 5 parts by weight with respect to 100 parts by weight of the dye. In relation to the solvent that may be included in the dye dispersion, the descriptions of the solvent that may be included in the pigment dispersion may be referred to. The amount of the solvent may be adjusted such that the dye dispersion has a solid content (e.g., amount) of about 5 wt % to about 30 wt %.

In some embodiments, the particle diameter of the dye may be determined in consideration of dispersion stability, pixel resolution, and/or the like. In an embodiment, a number average particle diameter of the dye may be in a range of about 30 nm to about 200 nm.

In some embodiments, the photosensitive resin composition according to embodiments of the disclosure may include a dispersant for improving dispersibility along with the pigment, and/or an additive for improving coating properties, and may include, for example, a dispersant such as a polyester-based dispersant, a polyurethane-based dispersant, and/or a polyacrylic dispersant, and/or a silicone-based surfactant, a fluorine-based surfactant, and/or the like.

In one or more embodiments, to improve curing efficiency and curing rate, as the additive, a thermal latent curing agent, a catalyst such as a photo-curable initiator, and/or the like may be utilized. For example, the additive may include a dicyandiamide-based compound, a dihydride compound, imidazole, urea, a sulfonium salt, a phosphonium salt, octylic acid, a metal compound such as platinum, tin, and/or the like.

The additive may be utilized in an amount of about 0.01 wt % to about 1 wt %, more In an embodiment, about 0.1 wt % to about 1 wt %, with respect to the total weight of the photosensitive resin composition.

Film Prepared by Curing Photosensitive Resin Composition

According to one or more embodiments, provided is a film formed by curing the photosensitive resin composition described above.

The film may be formed by a method utilized in the art, except that the photosensitive resin composition according to embodiments of the disclosure is utilized.

For example, the film may be formed by the following method: the photosensitive resin composition described above is coated on a substrate to a thickness of about 1 μm to 10 μm by a method such as spin coating or slit coating, and/or the like, and then irradiated with light so that a set or predetermined pattern is formed thereon, and then the resultant (product) is treated with a developer solution, and baked at a temperature of about 80° C. to about 250° C. for 30 seconds to 30 minutes to form a required pattern.

In one or more embodiments, the film may be formed by curing the photosensitive resin composition at a high temperature (e.g., about 80° C. or higher). For example, the curing may be performed at the temperature of 85° C. or higher. In other embodiments, the curing may be performed at a temperature of 120° C. or higher. In other embodiments, the curing may be performed at a temperature of about 160° C. or higher.

Electronic Apparatus Manufactured Utilizing Photosensitive Resin Composition

According to one or more embodiments, provided is an electronic apparatus including: a first substrate on which a plurality of light-emitting devices are arranged;
 a plurality of light controllers corresponding to the plurality of light-emitting devices on the first substrate; and
 a plurality of banks arranged between the plurality of light controllers,
 wherein at least one of the plurality of banks is formed of the photosensitive resin composition described above.

FIG. 1 is a cross-sectional view of an electronic apparatus according to an embodiment of the disclosure. One set of three color pixels of red, green, and blue or multiple sets of these three color pixels may be distributed in an actual product. In FIG. 1, "F" is an abbreviation for "Color Filter" and "QD" is an abbreviation for "Quantum Dot".

As illustrated, the electronic apparatus according to an embodiment of the disclosure has a structure in which a first substrate 110, which has light-emitting devices 120 arranged thereon, and a second substrate 210, which has, as light controllers, quantum dot layers 230R and 230G and color filter layers 220R, 220G, and 220W arranged thereon, are combined together with a filling material 300 arranged therebetween.

In other embodiments, the quantum dot layers 230R and 230G and the color filter layers 220R, 220G and 220W, which are light controllers, may be directly stacked on the light-emitting devices 120. For example, after the light controllers are directly stacked on the light-emitting devices 120 arranged on the first substrate, the first substrate and the second substrate may be combined together to manufacture an electronic apparatus. In this embodiment, a bank is present between the light controllers.

In other embodiments, after the quantum dot layers 230R and 230G and the color filter layers 220R, 220G, and 220W, which are light controllers, are directly stacked on the light-emitting device 120 arranged on the first substrate, the electronic apparatus may be manufactured without the second substrate.

First, the light-emitting devices 120 may have a structure in which an interlayer 123 including an emission layer is between a first electrode 122 and a second electrode 124, wherein light is generated on the principle that holes and electrons injected from the first electrode 122 and the second electrode 124 recombine in the emission layer in the interlayer 123 to emit light. Here, all the red, green, and blue pixels generate the same blue light. For example, the light-emitting devices 120 generate the same blue light, and the light controllers of each pixel is responsible for converting the blue light into red, green, or blue light. More details of the light-emitting devices 120 will be described below.

A reference numeral 121 indicates a pixel circuit connected to the first electrode 122, and includes elements such as a thin-film transistor and a capacitor. Reference numeral 130 indicates a thin-film encapsulation layer that protects the light-emitting device 120 by covering the same, and may be a single-layered film as an organic film or an inorganic film, or may be a multi-layered film in which an organic film and an inorganic film are alternately stacked. The inorganic film may include silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, acryl-based resin (for example, polymethylmethacrylate or polyacrylic acid), or one or more combinations thereof.

The light controllers may include a quantum dot layer, a color filter layer, or a combination thereof.

As the light controllers, the quantum dot layers 230R and 230G and the color filter layers 220R, 220G, and 220W are provided, wherein the quantum dot layers 230R and 230G convert the blue light generated by the light-emitting devices 120 into a desired or suitable color of red or green, and the color filter layers 220R, 220G, and 220W increase color purity by filtering out mixed colors of light that may be mixed in the color-changed light. Here, while the red pixel and the green pixel are provided with both (e.g., simultaneously) the quantum dot layers 230R and 230G and the color filter layers 220R and 220G, the blue pixel is provided only with the white color filter layer 220W, because the light generated by the light-emitting devices 120 is blue light. For example, the blue pixel does not need to change the color of light and only needs to pass the light through, and thus, is provided only with the white color filter layer 200W for filtering out mixed colors of light.

A reference numeral 250 may indicate a black matrix between each pixel for blocking light, and a reference numeral 240 may indicate a bank defining a boundary between the light controllers of each pixel.

For example, reference numeral 250 may indicate a color filter of a black pigment or a color filter of blue, green, or red pigment.

In one or more embodiments, the bank 240 and the black matrix 250 may be formed integrally. In this embodiment, an integrated form of the bank and the black matrix may include a black pigment and a scattering agent.

One surface of the bank 240 facing the first substrate 110 may have a hydrophobic property. This is a measure to prevent or reduce the one surface of the bank 240 from being contaminated by droplets sprayed from an inkjet when forming the quantum dot layers 230R and 230G by an inkjet method in the manufacturing process. To this end, the bank 240 has a biased arrangement structure in which a fluorine-containing polymer is concentrated toward one surface thereof. For example, the fluorine-containing polymer may include polytetra fluoroethylene (PTFE), perfluoro polyether (PFPE), or a combination thereof.

For example, when the electronic apparatus includes only the first substrate, a bank upper portion may be hydrophobic, in which the bank upper portion refers to the top of the bank in a direction opposite to the direction of gravity in a manufacturing process. Banks that are formed before the quantum dot layer and/or color filter layer, which are light controllers, are stacked on the first substrate in which the plurality of light-emitting devices are arranged. When the quantum dot layer and/or color filter layer is formed between formed banks by inkjet, the inkjet operation is facilitated because the upper portion of the bank is hydrophobic.

Monochromic light generated from a light source (for example, an organic light-emitting device) is converted into light having the color of one of red, green, and blue while passing through the quantum dot layers and the color filter layers, and then the converted light is emitted.

In some embodiments, to form banks, the photosensitive resin composition described above is applied onto a substrate and cured, and then subjected to a photolithography process. For more detailed processes, the descriptions provided above may be referred to.

Next, between the first substrate 110 and the second substrate 210, a filling material 300, which serves as both (e.g., simultaneously) a binding material and a gap maintainer, which enables an appropriate or suitable distance to be maintained between the two substrates 110 and 210. Accordingly, when the filling material 300 is coated between the two substrates 110 and 210, which are then bonded together, the filling material 300 firmly bonds the two substrates 110 and 210 while properly maintaining a gap therebetween.

The electronic apparatus having the structure described above may be manufactured through processes as illustrated in FIGS. 2A to 2F.

Figure 2A:
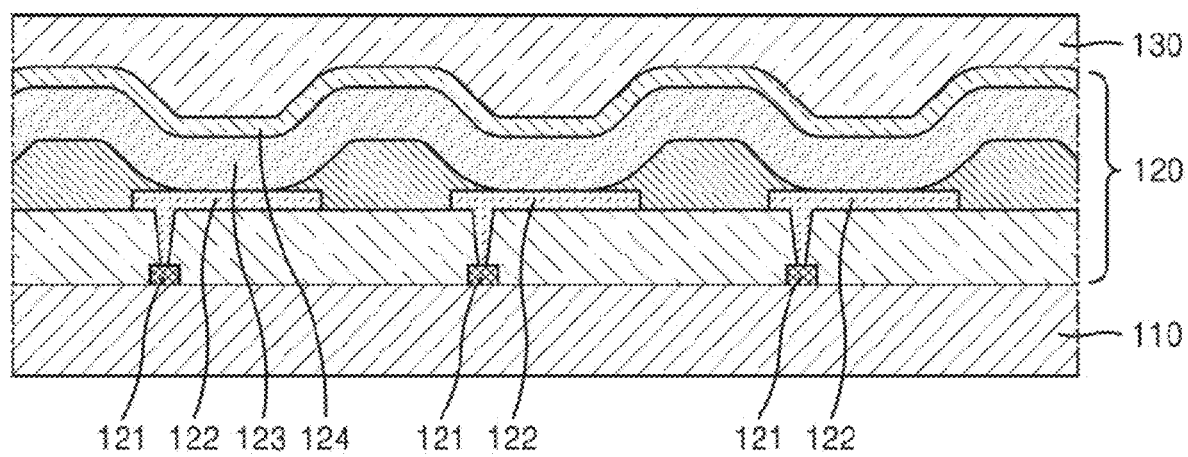
FIGS. 2A-2F are cross-sectional views sequentially illustrating a method of manufacturing the electronic apparatus illustrated in FIG. 1.

First, as shown in FIG. 2A, the light-emitting devices 120 are formed on the first substrate 110, and are covered with the thin-film encapsulation layer 130.

Figure 2B:
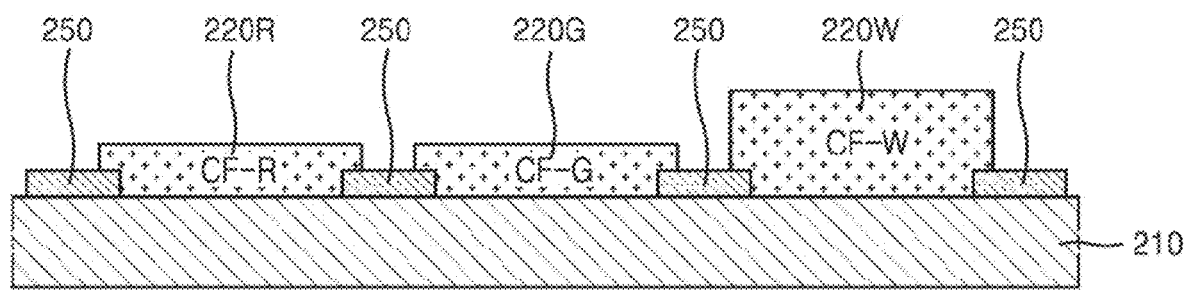

Then, as shown in FIG. 2B, the black matrix 250 and the color filter layers 220R, 220G, and 220W are each formed on the second substrate 210 through a photolithography process. The color filter layers 220R, 220G, and 220W are formed at positions in correspondence with the light-emitting devices 120.

Figure 2C:
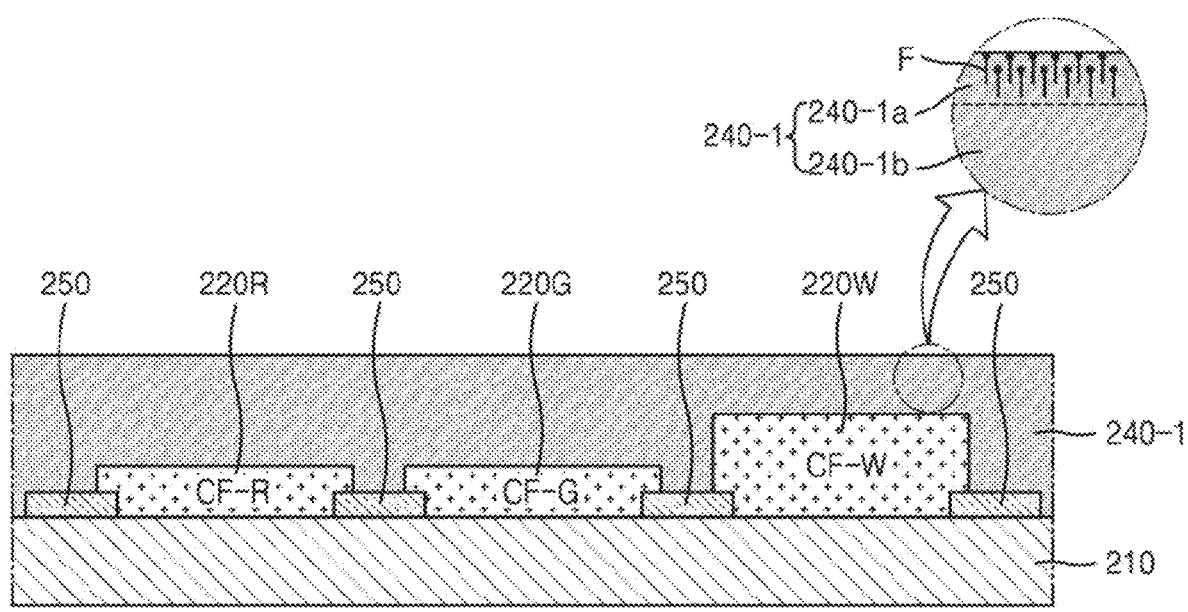

Subsequently, as shown in FIG. 2C, the upper portions of the color filter layers 220R, 220G, and 220W and the black matrix 250 are coated with a composite polymer 240-1 and then heated, the composite polymer 240-1 being a mixture of a fluorine-containing polymer 240-1a, such as polytetrafluoroethylene (PTFE), perfluoro polyether (PFPE) or a combination thereof, and fluorine-free materials 240-1b including, for example, a curable polymer, a photoresist compound, a black pigment, a scattering agent, a solvent, and/or the like. For example, the composite polymer 240-1, which is a mixture of the fluorine (F)-containing polymer 240-1a, and the fluorine-free materials 240-1b, including a curable polymer, a photoresist compound, a black pigment, a scattering agent, a solvent, and/or the like, is prepared, and coated and heated on the color filter layers 220R, 220G, and 220W, and the black matrix 250. The fluorine-free materials 240-1b may further include, for example, an acrylic polymer, a silicone compound, an epoxy group-containing compound, or one or more combinations thereof.

The composite polymer 240-1 is a material that will later become the first banks 240. When the composite polymer 240-1 is heated, the fluorine-containing polymer 240-1a moves from the inside toward one surface and is arranged biased. Accordingly, the one surface in which the fluorine-containing polymer 240-1a is concentrated has hydrophobicity. A curing temperature of the banks may be within a temperature range that does not affect quantum dot (QD) efficiency. In one or more embodiments, the curing temperature of the bank 240 may be from about 80° C. to about 250° C.

Figure 2D:
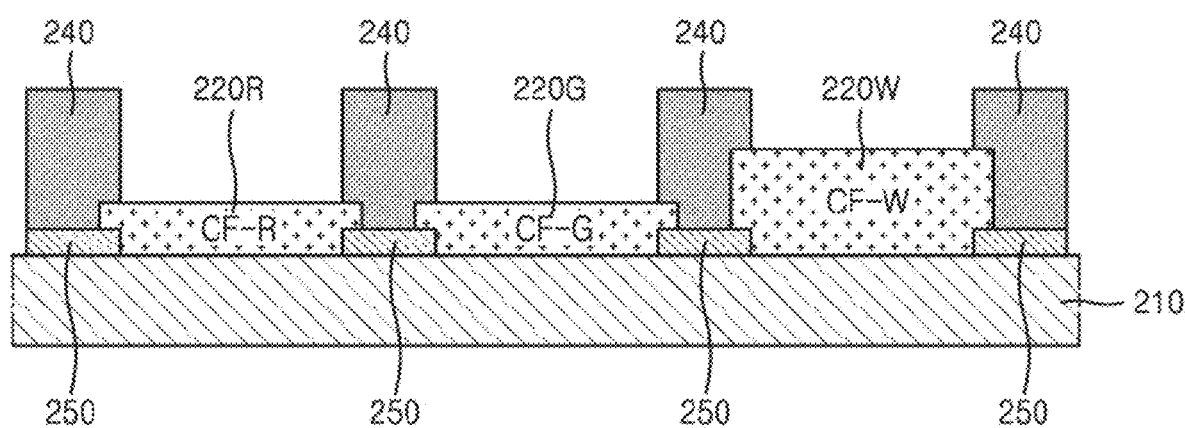

Then, as shown in FIG. 2D, the composite polymer 240-1 is patterned to remain only between the color filter layers 220R, 220G, and 220W of the respective pixels.

Figure 2E:
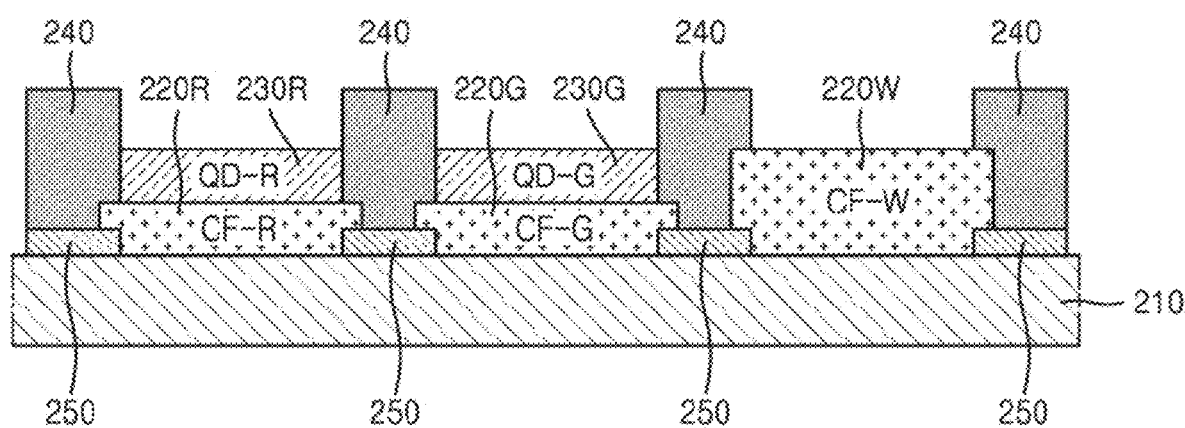

Then, as shown in FIG. 2E, the quantum dot layers 230R and 230G are formed selectively only on the red pixel and the green pixel, except for (excluding) the blue pixel. Here, the quantum dot layers 230R and 230G are formed at positions overlapping the color filter layers 220R and 220G. The quantum dot layers 230R and 230G may be formed by an inkjet process.

Quantum dots or cores that are light-conversion particles included in the quantum dot layers 230R and 230G may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or one or more combinations thereof.

Examples of the Group II-VI semiconductor compound may be a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or one or more combinations thereof.

Examples of the Group III-V semiconductor compound may be a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or one or more combinations thereof. In some embodiments, the Group III-V semiconductor compound may further include a Group II element. Examples of the Group III-V semiconductor compound further including a Group II element may be InZnP, InGaZnP, InAlZnP, etc.

Examples of the Group III-VI semiconductor compound may include: a binary compound, such as GaS, GaSe, $Ga_2Se_3$, GaTe, InS, $In_2S_3$, InSe, $In_2Se_3$, or InTe; a ternary compound, such as $InGaS_3$ or $InGaSe_3$; or one or more combinations thereof.

Examples of the Group I-III-VI semiconductor compound may be: a ternary compound, such as AgInS, $AgInS_2$, CuInS, $CuInS_2$, $CuGaO_2$, $AgGaO_2$, or $AgAlO_2$; or one or more combinations thereof.

Examples of the Group IV-VI semiconductor compound may be: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or one or more combinations thereof.

The Group IV element or compound may include: a single element compound, such as Si or Ge; a binary compound, such as SiC or SiGe; or one or more combinations thereof.

Each element included in a multi-element compound such as the binary compound, the ternary compound, and the quaternary compound may be present at a substantially uniform concentration or non-substantially uniform concentration in a particle.

In some embodiments, the quantum dot may have a single structure in which the concentration of each element in the quantum dot is substantially uniform, or a core-shell dual structure. For example, the material included in the core and the material included in the shell may be different from each other.

The shell of the quantum dot may contribute to an increase in the luminescence efficiency and stability by removing surface defects of the core and chemically stabilizing the quantum dot.

The shell may be a single layer or a multi-layer. The interface between the core and the shell may have a concentration gradient in which the concentration of an element existing in the shell decreases toward the center of the core.

Examples of the shell of the quantum dot may be an oxide of metal, or non-metal, a semiconductor compound, or one or more combinations thereof. Examples of the oxide of metal or non-metal may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and/or one or more combinations thereof. Examples of the semiconductor compound are, as described herein, Group III-VI semiconductor compounds; Group II-VI semiconductor compounds; Group III-V semiconductor compounds; Group III-VI semiconductor compounds; Group I-III-VI semiconductor compounds; Group IV-VI semiconductor compounds; or one or more combinations thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle may be improved (increased).

In some embodiments, the quantum dot may be in the form of a substantially spherical particle, a pyramidal particle, a multi-arm particle, a cubic nanoparticle, a nanotube particle, a nanowire particle, a nanofiber particle, or a nanoplate particle.

Because the energy band gap may be adjusted by controlling (selecting) the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented. In one or more embodiments, the size of the quantum dot may be selected to emit red, green and/or blue light. In some embodiments, the size of the quantum dot may be configured to emit white light by combination of light of one or more suitable colors.

Figure 2F:
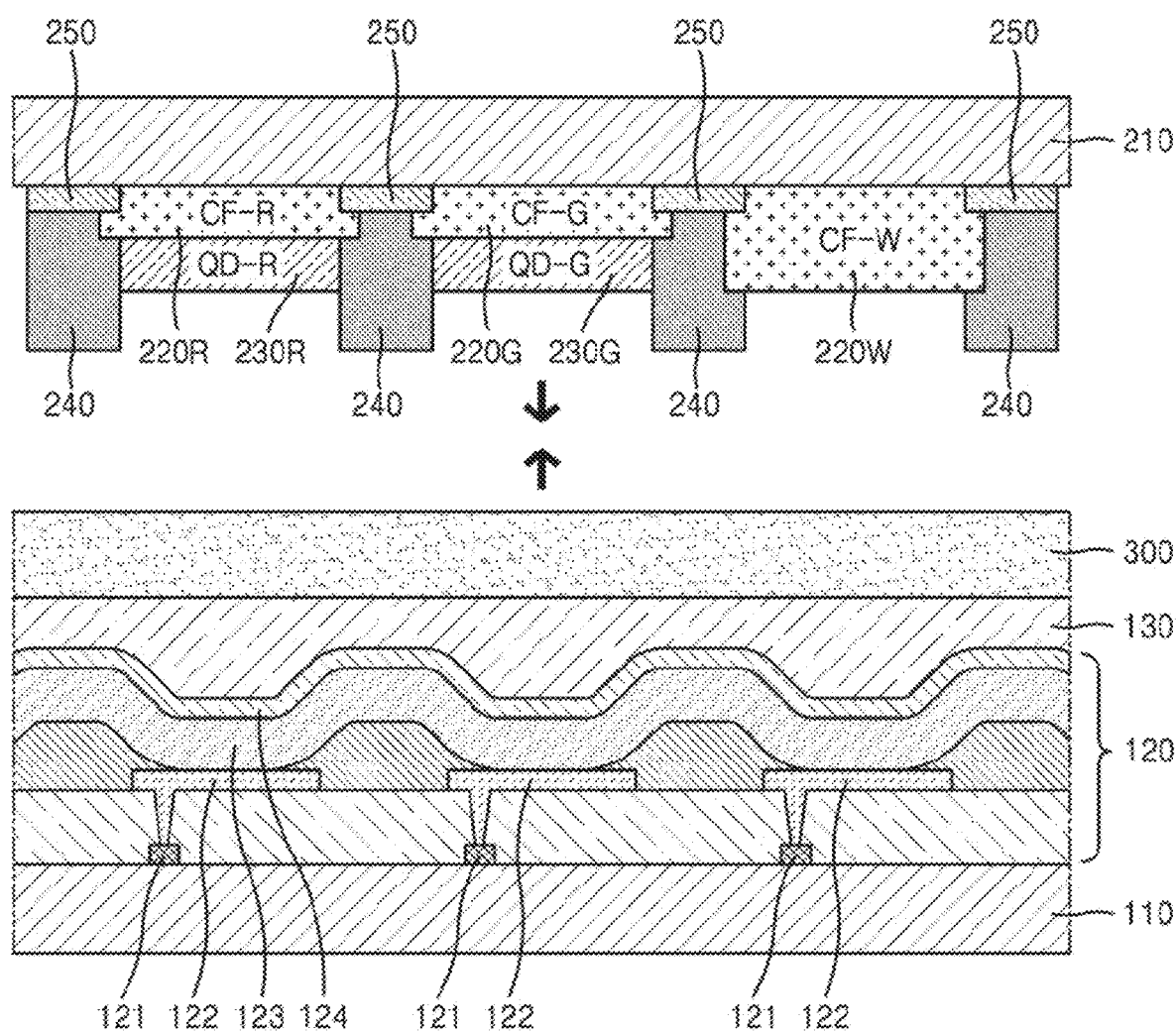

After the quantum dot layers 230R and 230G are formed, the filling material 300 is applied between the first substrate 110 and the second substrate 210, which are then combined as illustrated in FIG. 2F. As a result, as illustrated in FIG. 1, an electronic apparatus provided with the light-emitting device 120 and the quantum dot layers 230R and 230G, and the color filter layers 220R, 220G, and 220W are implemented.

Figure 3:
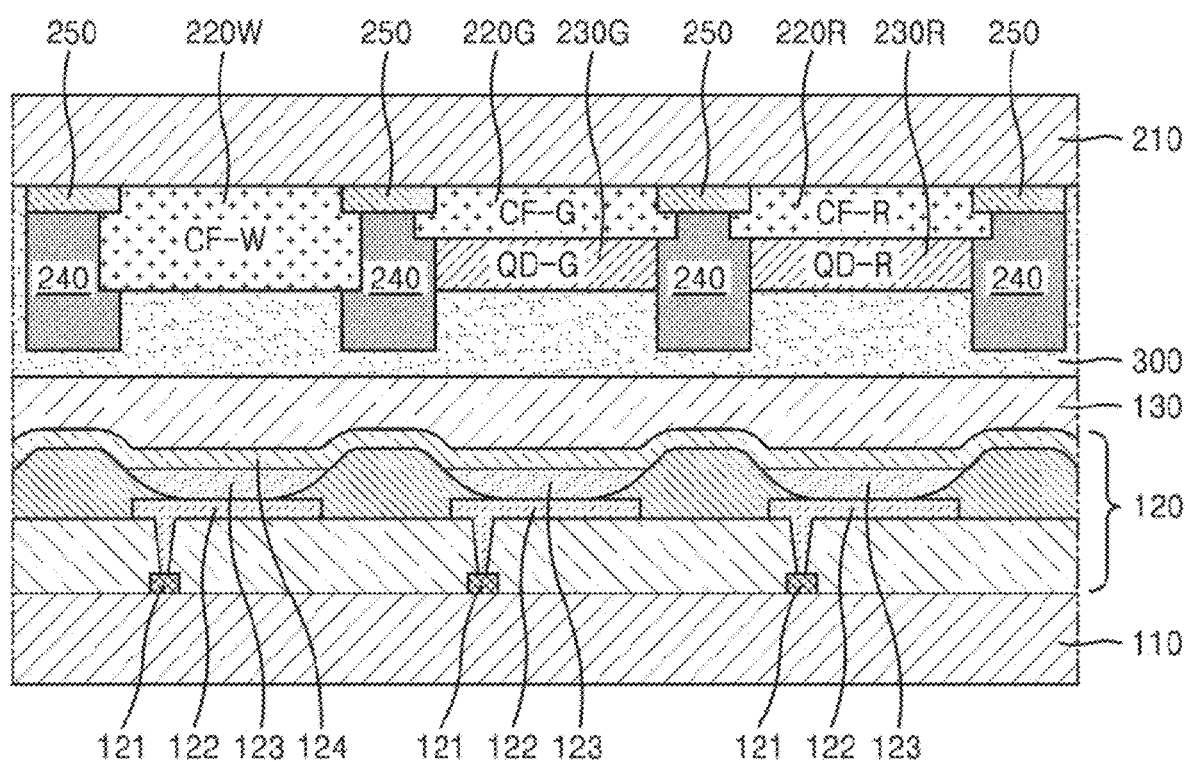
FIG. 3 shows a cross-sectional view of an electronic apparatus according to an embodiment of the disclosure.

In some embodiments, in the present embodiment, the interlayer 123 including the emission layer of the light-emitting devices 120 is formed as a common layer over the entire pixel area. However, as illustrated in FIG. 3, in other embodiments, the interlayer 123 may be formed separately for each pixel. For example, the interlayer 123 including the emission layer may be formed as a common layer, or may be formed separately for each pixel.

The emission layer may include an organic light-emitting material and/or an inorganic light-emitting material.

The light-emitting devices 120 may be one or more suitable types (kinds) of light-emitting devices such as an organic light-emitting device (OLED), an inorganic light-emitting device (LED), a micro LED, a quantum dot LED, a nanorod LED, or a LCD.

Hereinafter, embodiments in which the light-emitting devices 120 is an organic light-emitting device (OLED) will be described in more detail.

First Electrode 122

In FIG. 1, a substrate may be additionally located under the first electrode 122 or above the second electrode 124. As the substrate, a glass substrate or a plastic substrate may be utilized.

The first electrode 122 may be formed by, for example, depositing or sputtering a material for forming the first electrode 122 on the substrate. When the first electrode 122 is an anode, a material for forming the first electrode 122 may be a high work function material that facilitates injection of holes.

The first electrode 122 may be a reflective electrode, a semi-transmissive electrode, or a transmissive electrode. When the first electrode 122 is a transmissive electrode, a material for forming the first electrode 122 may include indium tin oxide (ITO), indium zinc oxide (IZO), tin oxide ($SnO_2$), zinc oxide (ZnO), or one or more combinations thereof. In one or more embodiments, when the first electrode 122 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or one or more combinations thereof may be utilized as a material for forming the first electrode 122.

The first electrode 122 may have a single-layered structure including (e.g., consisting of) a single layer or a multi-layered structure including a plurality of layers. In one or more embodiments, the first electrode 122 may have a three-layered structure of ITO/Ag/ITO.

Interlayer 123

The interlayer 123 may be on the first electrode 122. The interlayer 123 may include an emission layer.

The interlayer 123 may further include a hole transport region between the first electrode 122 and the emission layer and/or an electron transport region between the emission layer and the second electrode 124.

The interlayer 123 may further include, in addition to one or more suitable organic materials, metal-containing compounds such as organometallic compounds, inorganic materials such as quantum dots, and/or the like.

In one or more embodiments, the interlayer 130 may include, i) two or more emitting units sequentially stacked between the first electrode 110 and the second electrode 150, and ii) a charge generation layer between the two emitting units. When the interlayer 123 includes the emitting unit and the charge generation layer as described above, the light-emitting device 120 may be a tandem light-emitting device.

Hole Transport Region in Interlayer 123

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or one or more combinations thereof.

In one or more embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 122.

The hole transport region may include a compound represented by Formula 201, a compound represented by Formula 202, or a combination thereof:

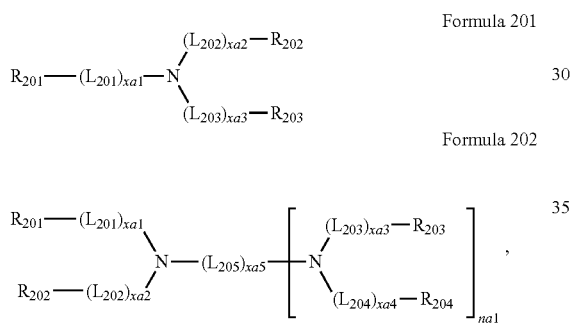

Formula 201

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$, $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217.

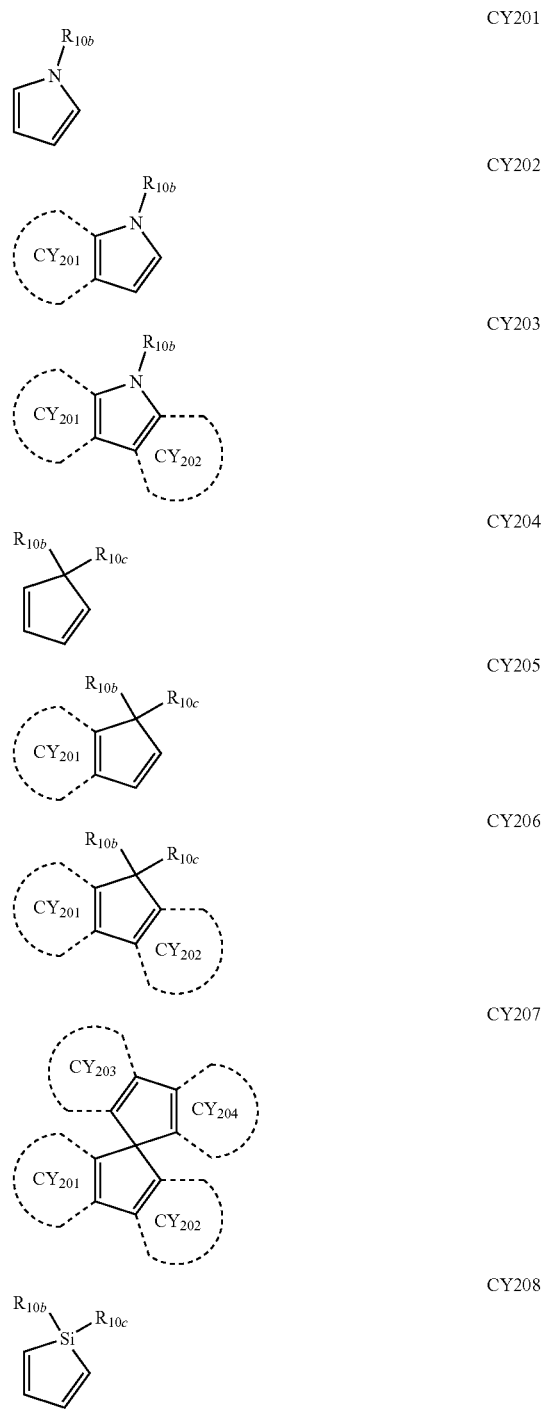

CY209
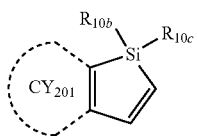

CY210
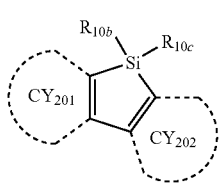

CY211
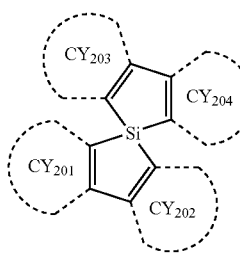

CY212

CY213
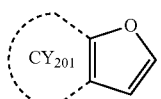

CY214
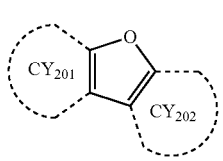

CY215

CY216
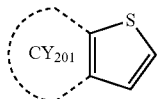

CY217
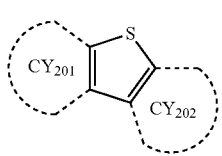

$R_{10b}$ and $R_{10c}$ in Formulae CY201 to CY217 may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory (suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and/or element EL2, or one or more combinations thereof.

Examples of the quinone derivative are TCNQ, F4-TCNQ, etc.

Examples of the cyano group-containing compound are HAT-CN, and a compound represented by Formula 221.

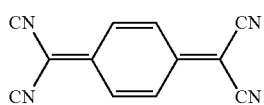
TCNQ

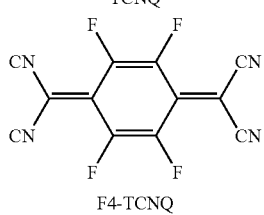
F4-TCNQ

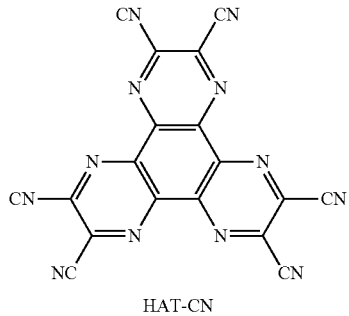
HAT-CN

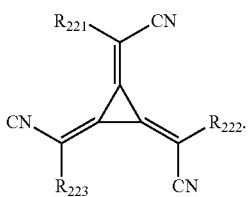

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or one or more combinations thereof.

In the compound including element EL1 and element EL2, element EL1 may be metal, metalloid, or one or more combinations thereof, and element EL2 may be non-metal, metalloid, or a combination thereof.

Emission Layer in Interlayer 139

When the light-emitting device 120 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other to emit white light. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or a combination thereof.

The amount of the dopant in the emission layer may be from about 0.01 part by weight to about 15 parts by weight based on 100 parts by weight of the host.

In one or more embodiments, the emission layer may include a quantum dot. The quantum dot is the same as described above.

In some embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

In one or more embodiments, the host may include a compound represented by Formula 301:

$$[Ar_{301}]_{xb11}\text{-}[(L_{301})_{xb1}\text{-}R_{301}]_{xb21}$$

Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are each the same as described herein with respect to $Q_{11}$.

For example, when xb11 in Formula 301 is 2 or more, two or more of $Ar_{301}(s)$ may be linked to each other via a single bond.

In one or more embodiments, the host may include a compound represented by Formula 301-1, a compound represented by Formula 301-2, or a combination thereof:

Formula 301-1

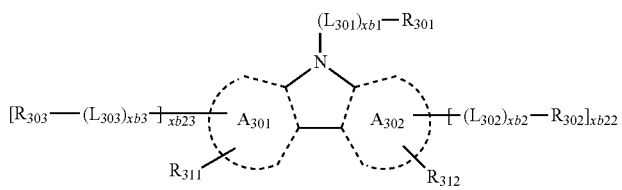

Formula 301-2

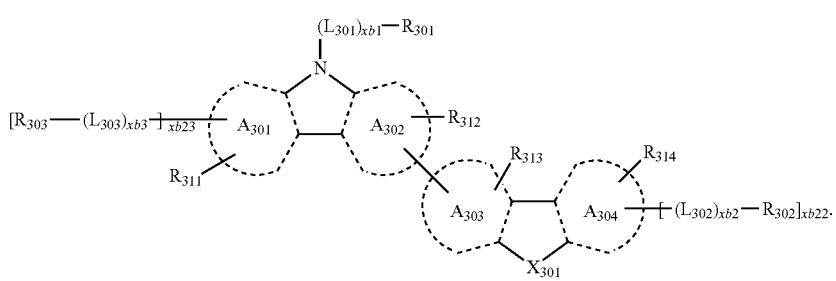

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each be the same as described herein with respect to $R_{301}$.

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or one or more combinations thereof.

The phosphorescent dopant may be electrically neutral.

For example, the phosphorescent dopant may include an organometallic compound represented by Formula 401:

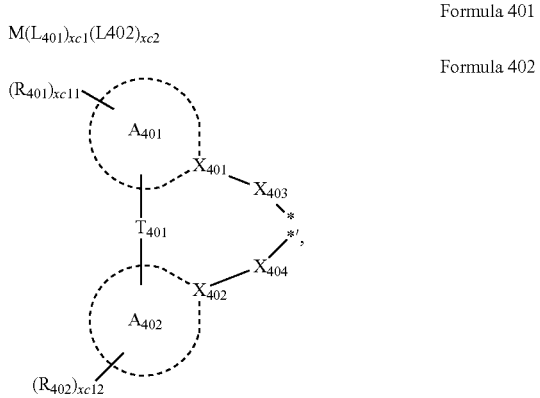

Formula 401

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}(s)$ may be identical to or different from each other, $L_{402}$ may be an organic ligand, and xc2 may be 0, 1, 2, 3, or 4, and when xc2 is 2 or more, two or more of $L_{402}(s)$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q_{11}$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described herein with respect to $Q_{11}$, xc11 and xc12 may each independently be an integer from 0 to 10, and

* and *' in Formula 402 each indicates a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}(s)$ in two or more of $L_{401}(s)$ may be optionally linked to each other via $T_{402}$, which is a linking group, or two ring $A_{402}(s)$ may be optionally linked to each other via $T_{403}$, which is a linking group (see, for example, Compounds PD1 to PD4 and PD7). $T_{402}$ and $T_{403}$ may each be the same as described herein with respect to $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus containing group (for example, a phosphine group, a phosphite group, etc.), or one or more combinations thereof.

Fluorescent Dopant

The fluorescent dopant may include an amine group-containing compound, a styryl group-containing compound, or a combination thereof.

For example, the fluorescent dopant may include a compound represented by Formula 501:

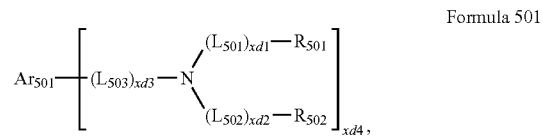

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

Delayed Fluorescence Material

The emission layer may include a delayed fluorescence material.

In the present disclosure, the delayed fluorescence material may be selected from compounds capable of emitting delayed fluorescent light based on a delayed fluorescence emission mechanism.

The delayed fluorescence material included in the emission layer may act as a host or a dopant depending on the type or kind of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 120 may be improved (increased).

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Electron Transport Region in Interlayer 123

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or one or more combinations thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In one or more embodiments, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

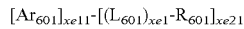   Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described herein with respect to $Q_{11}$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

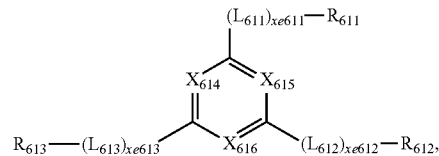

Formula 601-1 wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-Cao heterocyclic group unsubstituted or substituted with at least one $R_{10a}$.

For example, xe1 and xe611 to xe613 in Formulae 601 and 601-1 may each independently be 0, 1, or 2.

A thickness of the electron transport region may be from about 100 Å to about 5,000 Å, for example, from about 160 Å to about 4,000 Å. When the electron transport region includes a buffer layer, a hole-blocking layer, an electron control layer, an electron transport layer, or one or more combinations thereof, the thickness of the buffer layer, the hole-blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole-blocking layer, the electron control layer, the electron transport layer, and/or the electron transport region are within these ranges, satisfactory (suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or one or more combinations thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or one or more combinations thereof.

For example, the metal-containing material may include a Li complex. The Li complex may include, for example, Compound ET-D1 (LiQ) or ET-D2:

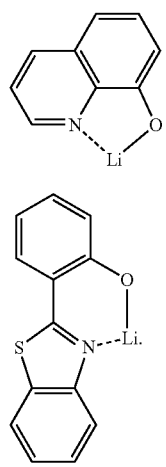

ET-D1

ET-D2

The electron transport region may include an electron injection layer that facilitates the injection of electrons from the second electrode 124. The electron injection layer may directly contact the second electrode 124.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or one or more combinations thereof.

The alkali metal may include Li, Na, K, Rb, Cs, or one or more combinations thereof. The alkaline earth metal may include Mg, Ca, Sr, Ba, or one or more combinations thereof. The rare earth metal may include Sc, Y, Ce, Tb, Yb, Gd, or one or more combinations thereof.

The alkali metal-containing compound, the alkaline earth metal-containing compound, and the rare earth metal-containing compound may be one or more oxides, halides (for example, fluorides, chlorides, bromides, and/or iodides), and/or tellurides of the alkali metal, the alkaline earth metal, and/or the rare earth metal, or one or more combinations thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or one or more combinations thereof. The alkaline earth metal-containing compound may include an alkaline earth metal oxide, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or one or more combinations thereof. In one or more embodiments, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or one or more combinations thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or one or more combinations thereof. For example, the electron injection layer may be a KI:Yb co-deposited layer, an RbI:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or one or more combinations thereof may be substantially uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory (suitable) electron injection characteristics may be obtained without a substantial increase in driving voltage.

Second Electrode 124

The second electrode 124 may be on the interlayer 123 having such a structure. The second electrode 124 may be a cathode, which is an electron injection electrode, and as the material for the second electrode 124, a metal, an alloy, an electrically conductive compound, or one or more combinations thereof, each having a low work function, may be utilized.

The second electrode 124 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The second electrode 124 may be a transmissive electrode, a semi-transmissive electrode, or a reflective electrode.

The second electrode 124 may have a single-layered structure or a multi-layered structure including two or more layers.

Capping Layer

A first capping layer may be outside the first electrode 122, and/or a second capping layer may be outside the second electrode 124. In more detail, the light-emitting device 120 may have a structure in which the first capping layer, the first electrode 122, the interlayer 123, and the second electrode 124 are sequentially stacked in this stated order, a structure in which the first electrode 122, the interlayer 123, the second electrode 124, and the second capping layer are sequentially stacked in this stated order, or a structure in which the first capping layer, the first electrode 122, the interlayer 123, the second electrode 124, and the second capping layer are sequentially stacked in this stated order.

Light generated in an emission layer of the interlayer 123 of the light-emitting device 120 may be extracted toward the outside through the first electrode 122, which is a semi-transmissive electrode or a transmissive electrode, and the first capping layer or light generated in an emission layer of the interlayer 123 of the light-emitting device 120 may be extracted toward the outside through the second electrode 124, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 120 is increased, so that the luminescence efficiency of the light-emitting device 120 may be improved (increased).

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or one or more combinations thereof. Optionally, the carbocyclic compound, the heterocyclic compound, and the amine group-containing compound may be substituted with a substituent including O, N, S, Se, Si, F, Cl, Br, I, or one or more combinations thereof.

In one or more embodiments, at least one selected from the first capping layer and the second capping layer may each independently include an amine group-containing compound.

For example, at least one selected from the first capping layer and the second capping layer may each independently include a compound represented by Formula 201, a compound represented by Formula 202, or a combination thereof.

Manufacturing Method

The layers included in the hole transport region, the emission layer, and the layers included in the electron transport region may be formed in a certain region by utilizing one or more suitable methods such as vacuum deposition, spin coating, casting, Langmuir-Blodgett (LB) deposition, ink-jet printing, laser-printing, laser-induced thermal imaging, and/or the like.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of the layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account the material to be included in the layer to be formed and the structure of the layer to be formed.

DEFINITION OF TERMS

The term "$C_3$-$C_{60}$ carbocyclic group" as utilized herein refers to a cyclic group including (e.g., consisting of) carbon only and having three to sixty carbon atoms, and the term "$C_1$-$C_{60}$ heterocyclic group" as utilized herein refers to a cyclic group that has one to sixty carbon atoms and further has, in addition to carbon, a heteroatom. The $C_3$-$C_{60}$ carbocyclic group and the $C_1$-$C_6$ heterocyclic group may each be a monocyclic group including (e.g., consisting of) one ring or a polycyclic group in which two or more rings are condensed with each other. For example, the number of ring-forming atoms of the $C_1$-$C_{60}$ heterocyclic group may be from 3 to 61.

The "cyclic group" as utilized herein may include the $C_3$-$C_{60}$ carbocyclic group, and the $C_1$-$C_{60}$ heterocyclic group.

The term "π electron-rich $C_3$-$C_{60}$ cyclic group" as utilized herein refers to a cyclic group that has three to sixty carbon atoms and does not include *—N=*' as a ring-forming moiety, and the term "π electron-deficient nitrogen-containing $C_1$-$C_{60}$ cyclic group" as utilized herein refers to a heterocyclic group that has one to sixty carbon atoms and includes *—N=*' as a ring-forming moiety.

For example,
the $C_3$-$C_{60}$ carbocyclic group may be i) group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein refer to a group condensed to any cyclic group, a monovalent group, or a polyvalent group (for example, a divalent group, a trivalent group, a tetravalent group, etc.) according to the structure of a formula for which the corresponding term is utilized. In one or more embodiments, "a benzene group" may be a benzo group, a phenyl group, a phenylene group, and/or the like, which may be understood by one of ordinary skill in the art according to the structure of a formula including the "benzene group."

Examples of the monovalent $C_3$-$C_{60}$ carbocyclic group and the monovalent $C_1$-$C_6$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_6$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof are an ethenyl group, a propenyl group, and/or a butenyl group. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof include an ethynyl group and/or a propynyl group. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by —$OA_{101}$ (wherein $A_{101}$ is the $C_1$-$C_{60}$ alkyl group), and examples thereof include a methoxy group, an ethoxy group, and/or an isopropyloxy group.

The term "$C_3$-$C_{10}$ cycloalkyl group" as utilized herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and examples are a 1,2,3,4-oxatriazolidinyl group, a tetrahydrofuranyl group, and/or a tetrahydrothiophenyl group. The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" utilized herein refers to a monovalent cyclic group that has three to ten carbon atoms and at least one carbon-carbon double bond in the ring thereof and no aromaticity, and examples thereof are a cyclopentenyl group, a cyclohexenyl group, and/or a cycloheptenyl group. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_{60}$ arylene group" as utilized herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_6$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as utilized herein refers to a divalent group having the same structure as the monovalent non-aromatic condensed polycyclic group described above.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as utilized herein refers to a divalent group having the same structure as the monovalent non-aromatic condensed heteropolycyclic group described above.

The term "$C_6$-$C_{60}$ aryloxy group" as utilized herein indicates —$OA_{102}$ (wherein $A_{102}$ is the $C_6$-$C_{60}$ aryl group), and the term "$C_6$-$C_{60}$ arylthio group" as utilized herein indicates —$SA_{103}$ (wherein $A_{103}$ is the $C_6$-$C_{60}$ aryl group).

The term "$R_{10a}$" as utilized herein refers to:
deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof, a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_{11}$ to $Q_{13}$, $Q_{21}$ to $Q_{23}$ and $Q_{31}$ to $Q_{33}$ utilized herein may each independently be: hydrogen; deuterium; —F; —Cl; —Br; —I; a hydroxyl group; a cyano group; a nitro group; $C_1$-$C_6$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_6$ alkoxy group, a phenyl group, a biphenyl group, or one or more combinations thereof.

The term "heteroatom" as utilized herein refers to any atom other than a carbon atom. Examples of the heteroatom are O, S, N, P, Si, B, Ge, Se, and one or more combinations thereof.

The term "Ph" as utilized herein refers to a phenyl group, the term "Me" as utilized herein refers to a methyl group, the term "Et" as utilized herein refers to an ethyl group, the term "ter-Bu" or "Bu$^t$" as utilized herein refers to a tert-butyl group, and the term "OMe" as utilized herein refers to a methoxy group.

The term "biphenyl group" as utilized herein refers to "a phenyl group substituted with a phenyl group." In other words, the "biphenyl group" is a substituted phenyl group having a $C_6$-$C_{60}$ aryl group as a substituent.

The term "terphenyl group" as utilized herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula.

Hereinafter, manufacture of electronic apparatuses according to embodiments of the disclosure and evaluation results thereof will be described with reference to examples.

Preparation of Bank Compositions

Example Composition 1

1 g of photo initiator (a combination of Irgacure OXE-1 and OXE-2), 70 g of epoxyacrylate, which is a first unit having photocurability, 30 g of 1,2-epoxy-4-vinylcyclohexane, which is a second unit having thermocurability, 30 g of phenol, which is a third unit having a hydrophilic property, 20 g of benzyl chloride, which is a fourth unit that is bulky, and 50 g of acrylic acid, which is the fifth unit that is a developing functional group were mixed in 200 mL of propylene glycol methyletheracetate (PGMEA) solvent to prepare a bank composition.

Comparative Example Composition 1

A bank composition was prepared in substantially the same manner as Example Composition 1, except that the amount of the first unit was changed to 50 g, the amount of the second unit was changed to 24 g, the amount of the third unit was changed to 24 g, the amount of the fourth unit was changed to 72 g, and the amount of the fifth unit was changed to 30 g.

Example Composition 2

A bank composition was prepared in substantially the same manner as Example Composition 1, except that 1 g of PFPE was further added as a leveling agent.

Comparative Example Composition 2

A bank composition was prepared in substantially the same manner as Example Composition 2, except that PTFE was utilized instead of PFPE.

Example 1

A SiO$_2$ CVD film was formed on glass, and Example Composition 1 was coated thereon and exposed to form an opening pattern having 80 µm in width and 140 µm in length. At this time, a curing process was performed thereon at a temperature of 180° C. for 10 minutes.

Then, quantum dot ink, in which InGaP quantum dots were dispersed with no-solvent, was inkjet-printed in the opening. At this time, with respect to the embodiments of 20 drops, 22 drops, 24 drops, and 27 drops of quantum dot ink, inkjet printing was performed. For each embodiment, a quantum dot pattern was formed in the opening pattern.

Comparative Example 1

An opening pattern was formed in substantially the same manner as Example 1 except that Comparative Example composition 1 was utilized instead of Example Composition 1, and quantum dot ink was inkjet printed.

Figure 7:
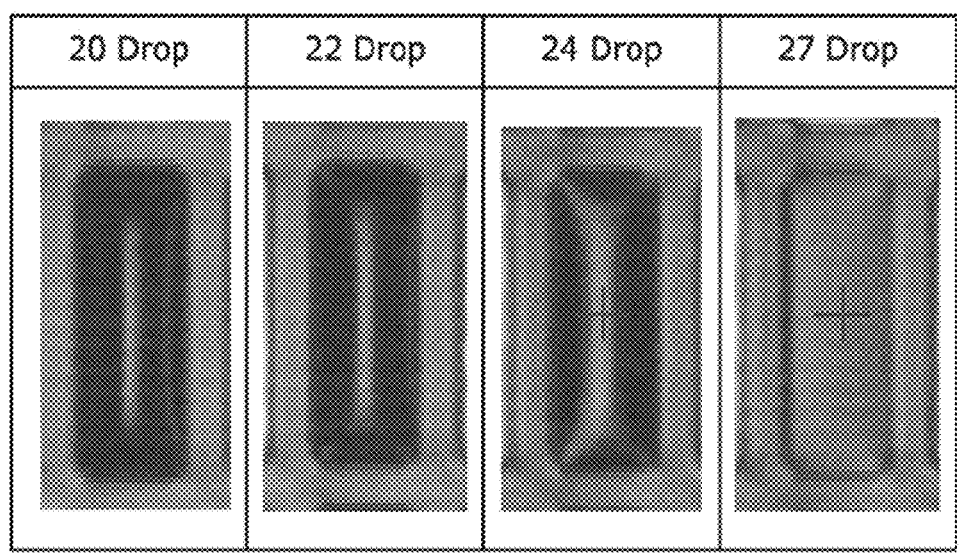
FIG. 7 shows images of the bank to which the composition according to Example 1 is applied, showing evaluation results of wettability during a printing process.
Figure 8:
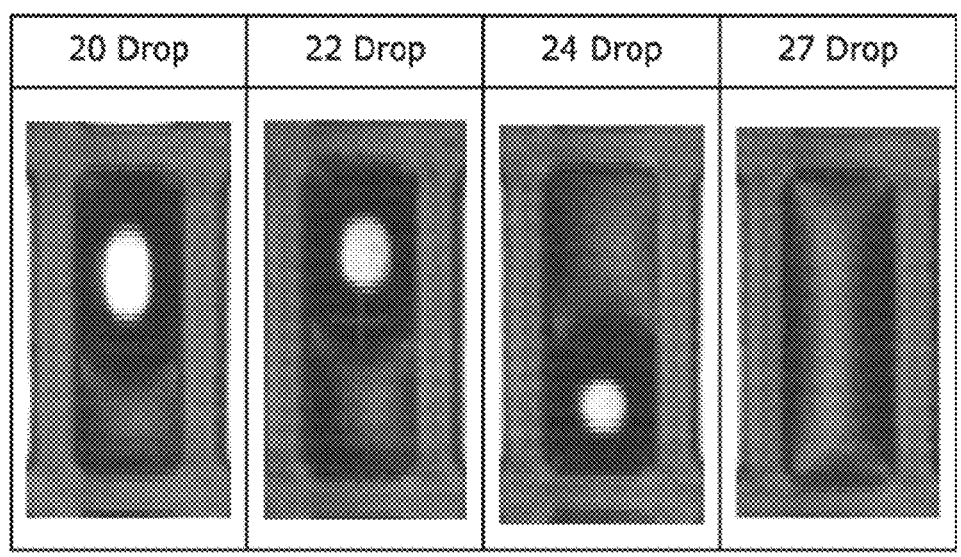
FIG. 8 shows images of the bank to which the composition according to Comparative Example 1 is applied, showing evaluation results of wettability during a printing process.

FIG. 7 shows top-view (plan view) images of quantum dot patterns formed by utilizing quantum dot ink of 20 drops, 22 drops, 24 drops, and 27 drops of Example 1. Likewise, FIG. 8 shows top-view (plan view) images of quantum dot patterns formed by utilizing quantum dot ink of 20 drops, 22 drops, 24 drops, and 27 drops of Comparative Example 1.

Referring to FIG. 7, in the embodiment of Example 1, a quantum dot pattern was formed throughout the opening even when the number of inkjet-printed droplets is small (e.g., 20 or 22 drops). In contrast, referring to FIG. 8, in the embodiment of Comparative Example 1, as the number of inkjet-printed droplets is decreased, the quantum dot pattern is formed only in a part (a portion) of the opening. When compared in terms of the degree of the spread and the symmetry of the spreading form of quantum dot ink in the quantum dot pattern, it can be seen that Example 1 showed a higher wettability of the inkjet-printed quantum dot pattern in the opening than Comparative Example 1.

Example 2

An opening pattern was formed in substantially the same way as Example 1 except that Example Composition 2 containing a leveling agent was utilized instead of Example Composition 1.

Then, quantum dot ink, in which InGaP quantum dots were dispersed with no-solvent, was inkjet-printed in the opening. At this time, with respect to the embodiments of 1 drop to 8 drops of quantum dot ink, inkjet printing was performed. For each embodiment, a quantum dot pattern was formed in the opening pattern.

Comparative Example 2

The opening pattern was formed in substantially the same manner as Example 2, except that Comparative Example Composition 2 was utilized instead of Example Composition 2, and the quantum dot ink was inkjet printed in the bank opening.

Figure 9:
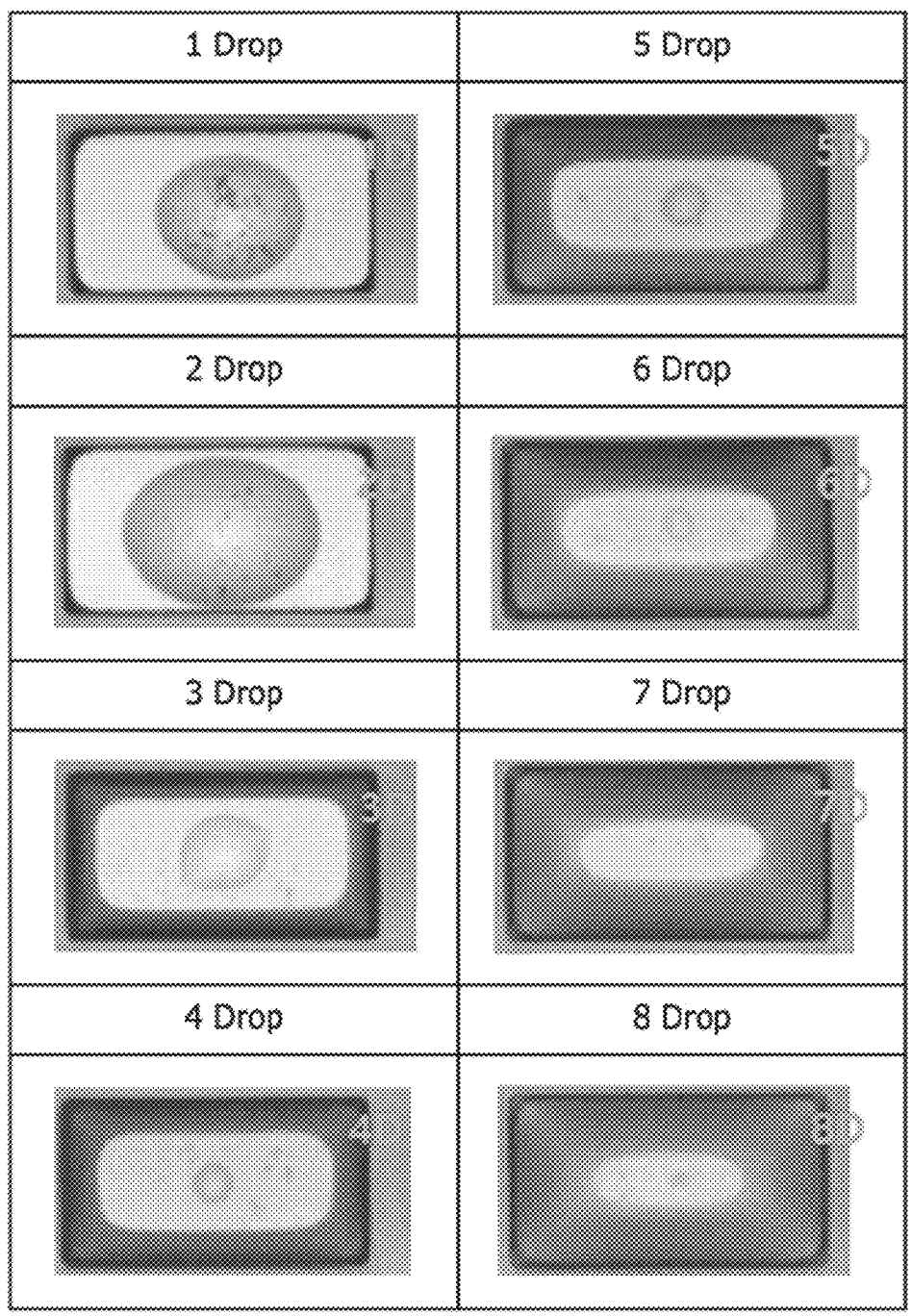
FIG. 9 shows top-view (plan view) images of quantum dot patterns formed by utilizing 1 drop to 8 drops of the quantum dot ink of Example 2.
Figure 10:
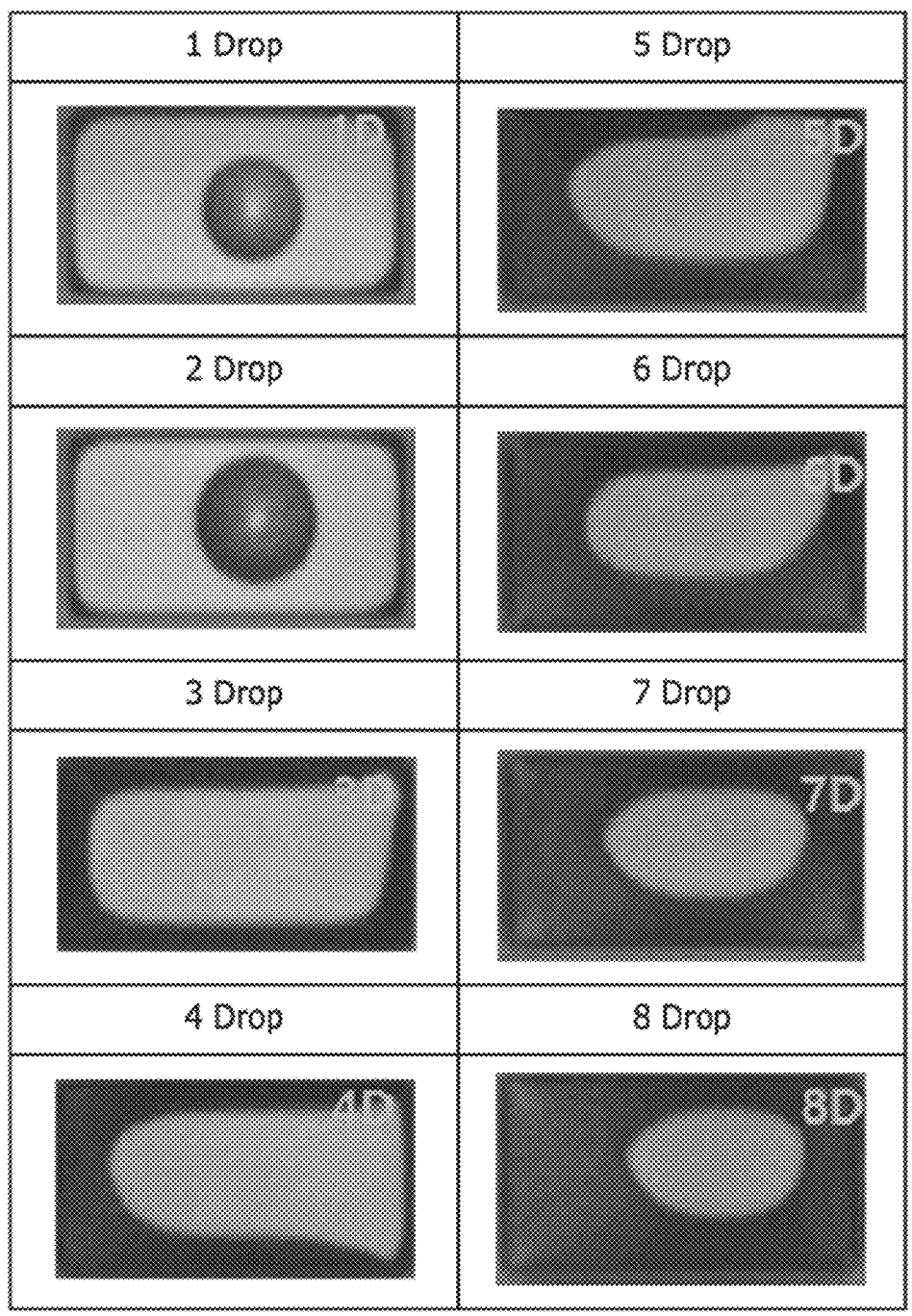
FIG. 10 shows top-view (plan view) images of quantum dot patterns formed by utilizing 1 drop to 8 drops of the quantum dot ink of Comparative Example 2.

FIG. 9 shows top-view images of quantum dot patterns formed by utilizing 1 drop to 8 drops of the quantum dot ink of Example 2. FIG. 10 shows top-view images of quantum dot patterns formed by utilizing 1 drop to 8 drops of the quantum dot ink of Comparative Example 2.

Referring to FIGS. 9 and 10, it can be seen that, in the embodiment of Example 2, as the number of drops of inkjet was increased, quantum dot ink filled the bank opening substantially symmetrically and uniformly, whereas in the embodiment of Comparative Example 2, as the number of drops of inkjet was increased, quantum dot ink filled the bank opening asymmetrically and non-uniformly. Accordingly, it can be seen that the wettability of the quantum dot pattern of Example 2 is superior to that of Comparative Example 2.

Figure 11A:
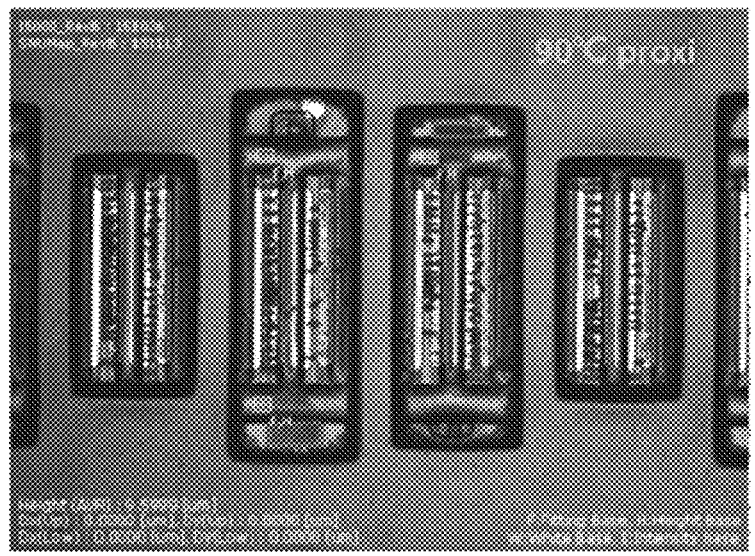
FIG. 11A shows an optical micrographic top-view (plan view) image of an embodiment in which Example Composition 2 was applied in forming a bank of a device including a step.
Figure 11B:
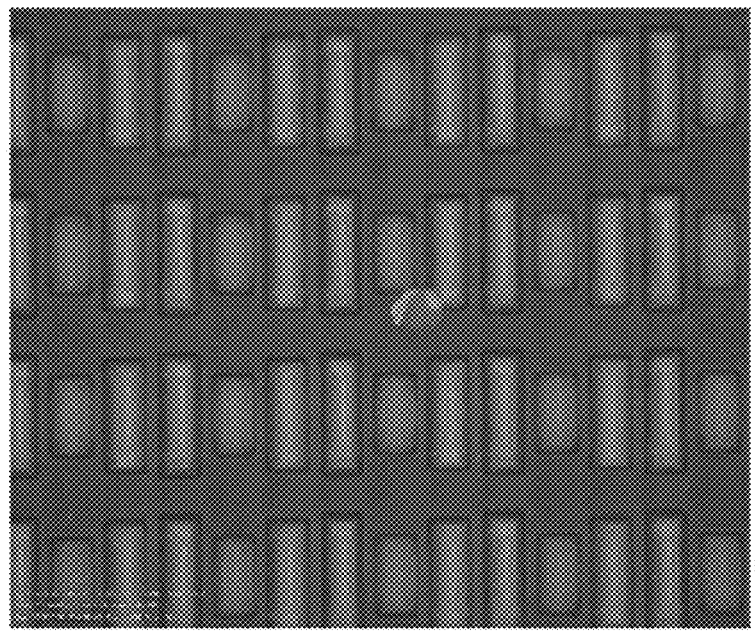
FIG. 11B shows an optical micrographic image of an embodiment in which a quantum dot pattern is formed in the opening of the formed bank by inkjet printing.

FIG. 11A shows an optical micrographic image of an embodiment in which Example Composition 2 was applied in forming a bank of a device including a step, and FIG. 11B shows an optical micrographic image of an embodiment in which a quantum dot pattern is formed in the opening of the formed bank by inkjet printing. FIGS. 11A and 11B correspond to magnifications of 10 and 5, respectively. In the images of FIGS. 11A and 11B, the opening of the bank is rectangular, and although not visible, a step is formed due to a hole under the opening of the bank. It appears that the quantum dot pattern is uniformly formed in the opening including the step.

Figure 12A:
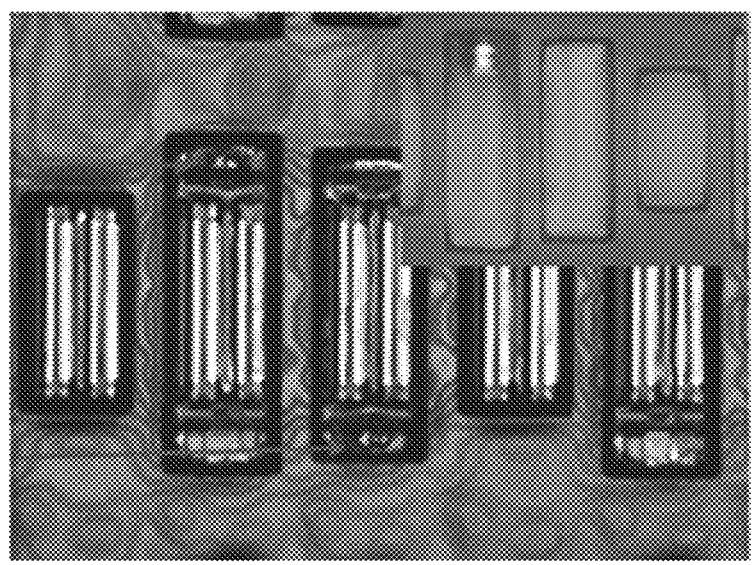
FIG. 12A shows an optical micrographic top-view image (plan view) of an embodiment in which Comparative Example Composition 2 was applied in forming a bank of a device including a step.
Figure 12B:
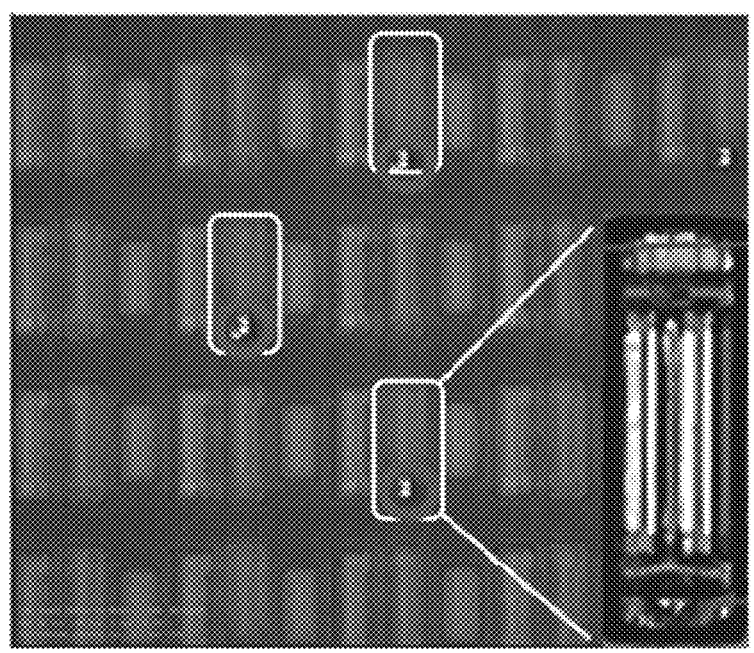
FIG. 12B shows an optical micrographic image of an embodiment in which a quantum dot pattern is formed in the opening of the formed bank by inkjet printing.

FIG. 12A shows an optical micrographic image of an embodiment in which Comparative Example Composition 2 was applied in forming a bank of a device including a step, and FIG. 12B shows an optical micrographic image of an embodiment in which a quantum dot pattern is formed in the opening of the formed bank by inkjet printing. FIGS. 12A and 12B correspond to magnifications of 10 and 5, respectively. In the images of FIGS. 12A and 12B, the edge portion in the opening of the bank corresponds to a portion in which a step, although not visible, is formed thereunder. It can be seen that the quantum dot pattern is non-uniformly formed in the portion where the step is present in the opening as indicated by a circle.

Accordingly, it can be seen that when the bank is formed utilizing the composition including the leveling agent according to the present embodiment, the wettability of the quantum dot layer formed in the opening is high even when there is a step in the opening area.

The present disclosure has been described with reference to the embodiments described above. However, the embodiments are only examples, and those of ordinary skill in the art should understand that one or more suitable modifications and variations of the embodiments can be made therefrom.

The photosensitive resin composition according to one aspect of the present disclosure contains a photo-curable unit, a thermo-curable unit, and a hydrophilic unit, each in a certain amount. Because the photo-curable unit and the hydrophilic unit are included much more than in embodiments of the related art, the redeposition of uncured components is prevented or reduced and hydrophilicity is increased, resulting in the improvement of the wettability during the inkjet process after banks are formed.

In some embodiments, because the photosensitive resin composition further includes a leveling agent containing an ether group, even when a residual film of the photosensitive resin composition remains in the step region, the wettability during the inkjet process can be improved.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A photosensitive resin composition comprising:
   a first unit comprising one or more acryloyl groups;
   a second unit comprising one or more epoxy groups;
   a third unit comprising one or more hydrophilic groups; and
   a solvent,
   wherein a ratio of the equivalent weight of the acryloyl groups of the first unit to the equivalent weight of the epoxy groups of the second unit is 2:1 or more.

2. The photosensitive resin composition of claim 1, wherein
   a ratio of the equivalent weight of the hydrophilic groups to the equivalent weight of the epoxy groups is 1:1 or more.

3. The photosensitive resin composition of claim 1, wherein
   the hydrophilic groups comprise a hydroxyl group, a carboxyl group, an imide group, an epoxy group, an ether group, or a combination thereof.

4. The photosensitive resin composition of claim 1, wherein
   a sum of the amount of the first unit and the amount of the second unit is about 30 wt % to about 70 wt % based on the total weight of the photosensitive resin composition excluding the solvent.

5. The photosensitive resin composition of claim 1, wherein
   the first unit further comprises a monomer or oligomer with 2 to 8 acryloyl groups, wherein a weight average molecular weight (Mw) of the first unit is 5,000 or less.

6. The photosensitive resin composition of claim 1, further comprising
   a fourth unit comprising one or more cyclic groups, wherein
   an equivalent weight of the fourth unit is 70% or less based on the equivalent weight of the epoxy group.

7. The photosensitive resin composition of claim 1, further comprising
   a fifth unit, wherein an acid value of the fifth unit is 50 mg KOH/g or more and 250 mg KOH/g or less, and wherein a ratio of the equivalent weight of the epoxy groups to the equivalent weight of the fifth unit is 1.5:1 or less.

8. The photosensitive resin composition of claim 1, further comprising
a leveling agent comprising an ether group (—O—).

9. The photosensitive resin composition of claim 8, wherein
the leveling agent comprises a compound represented by Formula 1:

$$A\text{-}[O_{a1}\text{—}B_{b1}]_{n1}\text{—}[O_{a2}\text{—}C_{b2}]_{n2}\text{—}[O_{a3}\text{-}D_{b3}]_{n3}\text{-}E \qquad \text{Formula 1}$$

$$CF_xX_{(3-x)}(1 \leq x \leq 3) \qquad \text{Formula 2}$$

$$CF_yX_{(2-y)}(1 \leq y \leq 2) \qquad \text{Formula 3}$$

wherein, in Formula 1,
A is a group represented by Formula 2,
B, C, and D are each independently a group represented by Formula 3,
E is hydrogen, a halogen atom, a carboxyl group, a ketone group, a sulfonic acid group, an acrylate group, a hydroxyl group, or one or more salts thereof,
a1, a2, and a3 are each independently 0 or 1,
b1, b2, and b3 are each independently an integer from 1 to 5,
n1, n2, and n3 are each independently an integer from 0 to 10, and n1+n2+n3≥1, and
in Formula 2 and Formula 3,
X is H, Cl, or $CY_3$, wherein Y is F or Cl.

10. The photosensitive resin composition of claim 8, wherein
the ether group (—O—) comprises a —$CF_2$—O— group.

11. The photosensitive resin composition of claim 8, wherein
the leveling agent comprises perfluoropolyether (PFPE), perfluoroalkyl ether carboxylic acid (PFECA), a perfluoroalkyl ethercarboxylate anionic polymer, chlorinated polyfluorinated ether sulfonate (CPFESA), or a combination thereof.

12. The photosensitive resin composition of claim 8, wherein
an amount of the leveling agent is from about 0.1 wt % to about 3.0 wt % based on the total weight of the photosensitive resin composition excluding the solvent.

13. The photosensitive resin composition of claim 1, further comprising
one or more selected from a crosslinking agent, an initiator, a thermo-curing agent, a pigment and a scattering agent.

14. A film prepared by curing the photosensitive resin composition of claim 1.

15. An electronic apparatus comprising:
a first substrate on which a plurality of light-emitting devices are located,
a plurality of light controllers corresponding to the plurality of light-emitting devices on the first substrate; and
a plurality of banks arranged among the plurality of light controllers, wherein
at least one of the plurality of banks is formed by the photosensitive resin composition of claim 1.

16. The electronic apparatus of claim 15, wherein
the plurality of banks are cured by performing a baking process at a temperature of about 80° C. to about 250° C.

17. The electronic apparatus of claim 15, wherein
the plurality of light controllers comprise a quantum dot layer, a color filter layer, or a combination thereof.

18. The electronic apparatus of claim 15, wherein
the light-emitting devices comprise an organic light-emitting device (OLED), an inorganic light-emitting device (LED), a micro LED, a quantum dot LED, a nanorod LED, or a LCD.

19. The electronic apparatus of claim 15, wherein
a portion exposed among the plurality of banks comprises a step.

20. The electronic apparatus of claim 15, wherein
the plurality of light controllers are formed by an inkjet printing process.

* * * * *